US008742547B2

(12) United States Patent
Yoshizawa et al.

(10) Patent No.: US 8,742,547 B2
(45) Date of Patent: Jun. 3, 2014

(54) SEMICONDUCTOR WAFER AND ITS MANUFACTURE METHOD, AND SEMICONDUCTOR CHIP

(75) Inventors: Kazutaka Yoshizawa, Yokohama (JP); Taiji Ema, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/027,695

(22) Filed: Feb. 15, 2011

(65) Prior Publication Data

US 2011/0233735 A1 Sep. 29, 2011

(30) Foreign Application Priority Data

Mar. 24, 2010 (JP) .................................. 2010-068648
Sep. 27, 2010 (JP) .................................. 2010-215753

(51) Int. Cl.
*H01L 23/544* (2006.01)
*H01L 21/44* (2006.01)
*H01L 23/58* (2006.01)

(52) U.S. Cl.
CPC .................................. *H01L 23/585* (2013.01)
USPC .................. 257/620; 257/758; 257/E23.179; 257/E23.194; 257/E21.532; 257/E21.599; 257/E21.705; 438/106; 438/109; 438/113; 438/460; 438/462

(58) Field of Classification Search
USPC ................. 257/620, 758, E23.179, E23.194, 257/E21.532, E21.599, E21.705; 438/106, 438/109, 113, 460, 462
See application file for complete search history.

(56) References Cited

U.S. PATENT DOCUMENTS

| 5,831,330 | A | 11/1998 | Chang |
| 6,365,958 | B1 * | 4/2002 | Ibnabdeljalil et al. ........ 257/620 |
| 6,521,975 | B1 | 2/2003 | West et al. |
| 6,841,455 | B2 | 1/2005 | West et al. |

(Continued)

FOREIGN PATENT DOCUMENTS

| JP | 2000-150429 A | 5/2000 |
| JP | 2001-23937 A | 1/2001 |

(Continued)

OTHER PUBLICATIONS

Chinese Office Action dated Dec. 5, 2012, issued in corresponding Chinese Patent Application No. 201110049434.7 (English translation only).

(Continued)

*Primary Examiner* — Peniel M Gumedzoe
(74) *Attorney, Agent, or Firm* — Westerman, Hattori, Daniels & Adrian, LLP

(57) ABSTRACT

A semiconductor wafer includes: a first semiconductor chip area formed with a semiconductor element; a second semiconductor chip area formed with a semiconductor element; and a scribe area sandwiched between the first and second semiconductor chip areas; wherein: the first semiconductor chip area includes a first metal ring surrounding the semiconductor element formed in the first semiconductor chip area; and the metal ring is constituted of a plurality of metal layers including a lower metal layer and an upper metal layer superposed upon the lower metal layer, and the upper metal layer is superposed upon the lower metal layer in such a manner that an outer side wall of the upper metal layer is flush with the outer side wall of the lower metal layer or is at an inner position of the first semiconductor chip area relative to the outer side wall of the lower metal layer.

8 Claims, 27 Drawing Sheets

(56) References Cited

U.S. PATENT DOCUMENTS

| | | | |
|---|---|---|---|
| 2002/0024115 A1 | 2/2002 | Ibnabdeljalil et al. | |
| 2004/0026785 A1 | 2/2004 | Tomita | |
| 2004/0150070 A1* | 8/2004 | Okada et al. | 257/508 |
| 2004/0188845 A1 | 9/2004 | Iguchi et al. | |
| 2004/0212047 A1* | 10/2004 | Joshi et al. | 257/620 |
| 2005/0116333 A1 | 6/2005 | Akiyama | |
| 2006/0012012 A1* | 1/2006 | Wang et al. | 257/620 |
| 2007/0087067 A1* | 4/2007 | Yuan et al. | 425/116 |
| 2007/0158788 A1* | 7/2007 | Yang | 257/620 |
| 2007/0253276 A1 | 11/2007 | Ochi | |
| 2008/0122039 A1* | 5/2008 | Liu | 257/620 |
| 2008/0157285 A1* | 7/2008 | Tokitoh | 257/620 |
| 2008/0230874 A1 | 9/2008 | Yamada et al. | |
| 2008/0283969 A1* | 11/2008 | Jeng et al. | 257/620 |
| 2009/0039471 A1 | 2/2009 | Katagiri | |
| 2010/0109128 A1* | 5/2010 | West et al. | 257/620 |
| 2010/0133669 A1* | 6/2010 | Jao | 257/669 |

FOREIGN PATENT DOCUMENTS

| | | |
|---|---|---|
| JP | 2004-79596 A | 3/2004 |
| JP | 2004-296904 A | 10/2004 |
| JP | 2004-311930 A | 11/2004 |
| JP | 2007-299900 A | 11/2007 |
| JP | 2008-270720 A | 11/2008 |
| JP | 2009-43779 A | 2/2009 |

OTHER PUBLICATIONS

Japanese Office Action dated Mar. 4, 2014, issued in Japanese Patent Application No. 2010-215753, w/partial English translation, (5 pages).

* cited by examiner

SEMICONDUCTOR WAFER AND ITS MANUFACTURE METHOD, AND SEMICONDUCTOR CHIP

CROSS-REFERENCE TO RELATED APPLICATIONS

This application is based upon and claims the benefit of priority of the prior Japanese Patent Application JP2010-068648, filed on Mar. 24, 2010, and the Japanese Patent Application JP2010-215753, filed on Sep. 27, 2010, the entire contents of which are incorporated herein by reference.

FIELD

The embodiments discussed herein are related to techniques of dicing a semiconductor wafer and separating into individual semiconductor chips.

BACKGROUND

A number of semiconductor chips are formed on a semiconductor wafer involving scribe areas. The semiconductor wafer is cut along the scribe areas and separated into individual semiconductor chips. If cracks formed in the scribe areas during scribing propagate into the semiconductor chip, the chips are broken.

A moisture proof ring is generally formed along the border of a semiconductor chip. The technique of further forming a metal ring outside the moisture proof ring to suppress propagation of cracks into the semiconductor chip has been proposed (Japanese Patent Laid-open Publication No. 2008-270720). Techniques of enhancing the crack propagation suppressing effects of the metal ring have long been desired.

SUMMARY

According to one aspect of the present invention, a semiconductor wafer includes:

a first semiconductor chip area formed with semiconductor elements;

a second semiconductor chip area formed with semiconductor elements; and a scribe area sandwiched between the first semiconductor chip area and the second semiconductor chip area;

wherein:

The first semiconductor chip area includes a first metal ring surrounding semiconductor elements formed in the first semiconductor chip area;

The first metal ring is constituted of a plurality of metal layers including an lower metal layer and an upper metal layer superposed upon the lower metal layer, and the upper metal layer is superposed upon the lower metal layer in such a manner that an outer side wall of an upper metal layer in the first semiconductor chip area is flush with the outer side wall of a lower metal layer or is at an inner position of the first semiconductor chip area relative to the outer side wall of the lower metal layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First, with reference to FIGS. 1 to 4, description will be made on a crack guard ring structure according to the first embodiment of the present invention. A structure including a crack guard ring formed by laminating metal layers; a crack guard insulating film disposed under the crack guard ring; and a crack guard window exposing the upper surface of the uppermost metal layer of the crack guard ring is called a crack guard ring structure.

Figure 1:
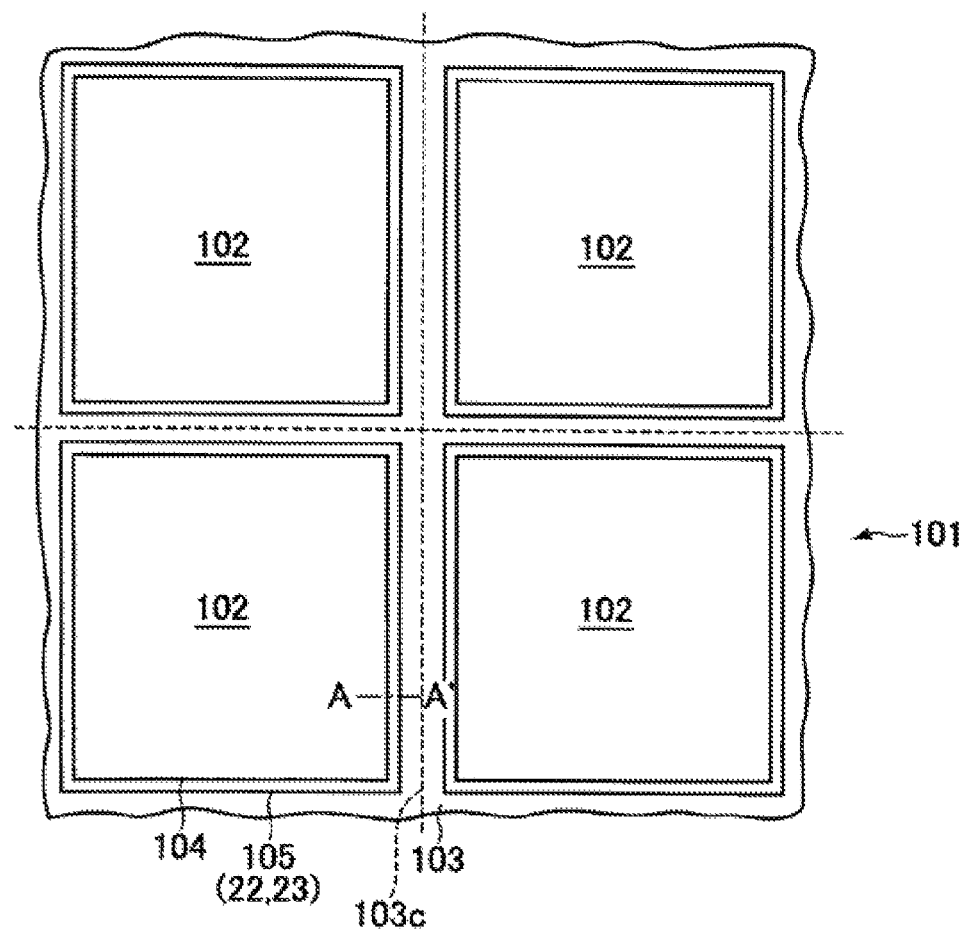
FIG. 1 is a plan view schematically illustrating a semiconductor wafer having a crack guard ring structure according to an embodiment of the present invention.

FIG. 1 is a schematic plan view schematically illustrating a semiconductor wafer 101 equipped with a crack guard ring structure of the first embodiment. Plurality of semiconductor chip areas 102 are disposed on the semiconductor wafer 101 in a matrix shape. A scribe area 103 is defined between adjacent semiconductor chip areas. The semiconductor wafer 101 is cut along a center line (scribe center) 103c of the scribe area 103 and separated into respective semiconductor chips 102.

A crack guard ring 105 of the first embodiment is formed in the outermost circumference portion of each semiconductor area 102 along the border of the semiconductor chip area 102. An area inner than the crack guard ring 105 is called a semiconductor chip area 102, and an area outside the crack guard ring 105 is called a scribe area 103. The crack guard ring 105 is provided in order to guard propagation of a crack formed in the scribe area 103 while the semiconductor wafer 101 is cut, into the semiconductor chip area 102.

A moisture proof ring 104 is formed inside the crack guard ring 105 in each semiconductor chip area 102 along the border of the semiconductor chip area 102. Inside the moisture proof ring 104, a number of desired semiconductor elements are formed. A size (chip size) of each semiconductor chip area 102 is, e.g., about 5 mm square. A width of the scribe area 103 is, e.g., about 50 micrometers.

As will be later described, a crack guard insulating film 22 is formed under the crack guard ring 105, and a crack guard window 23 is formed above the crack guard ring 105. The crack guard insulating film 22 and crack guard window 23 are also formed along the border of the semiconductor chip area 102.

Description will now be made on a manufacture process for a semiconductor wafer equipped with the crack guard ring structure of the first embodiment and the structures of the crack guard ring and the like.

Figure 2A:
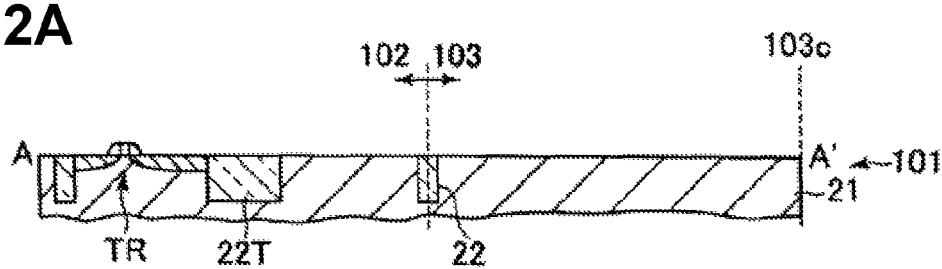
FIGS. 2A to 2G are schematic cross sectional views in a thickness direction illustrating main manufacture processes for a semiconductor wafer equipped with a crack guard ring structure of a first embodiment.
Figure 2B:
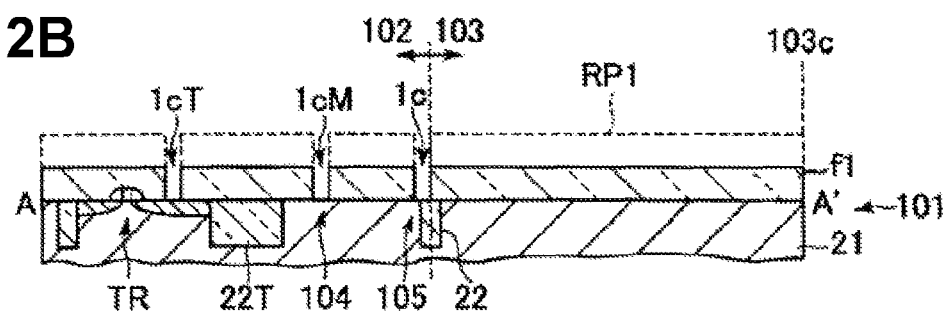
Figure 2C:
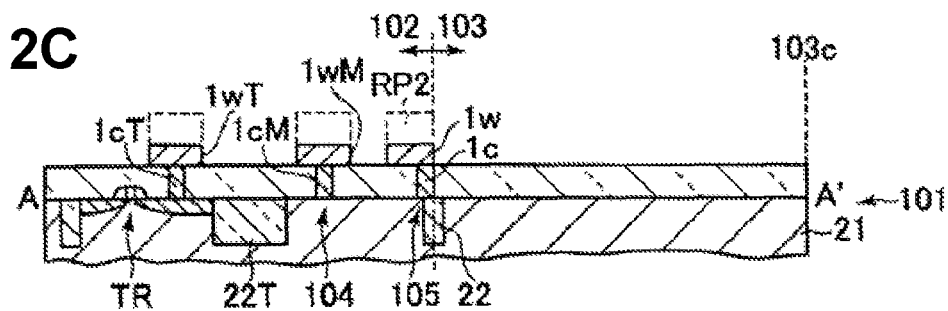
Figure 2D:
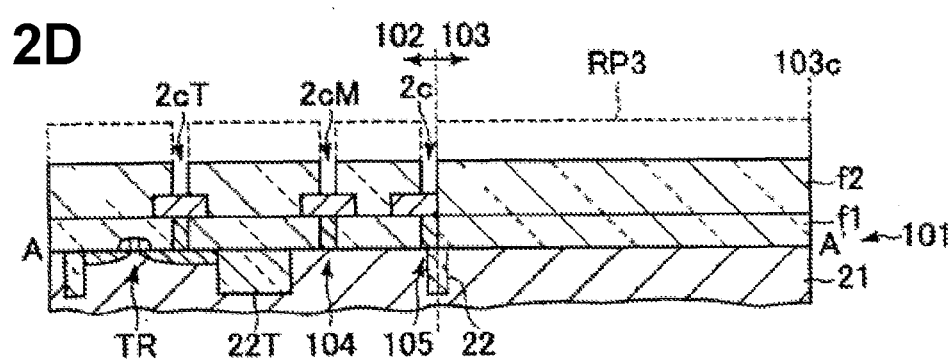
Figure 2E:
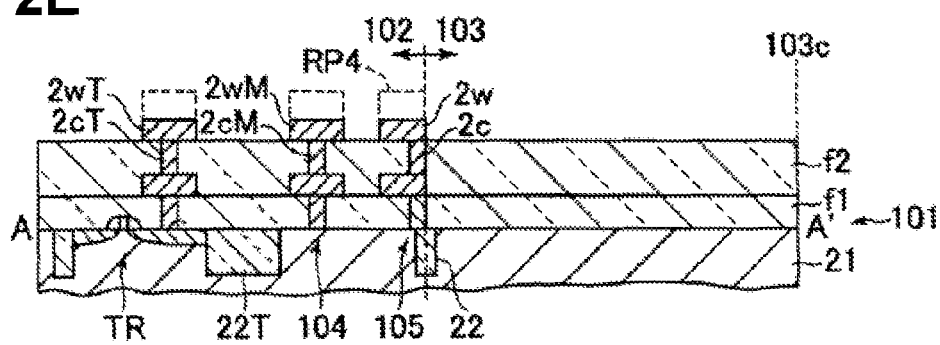
Figure 2F:
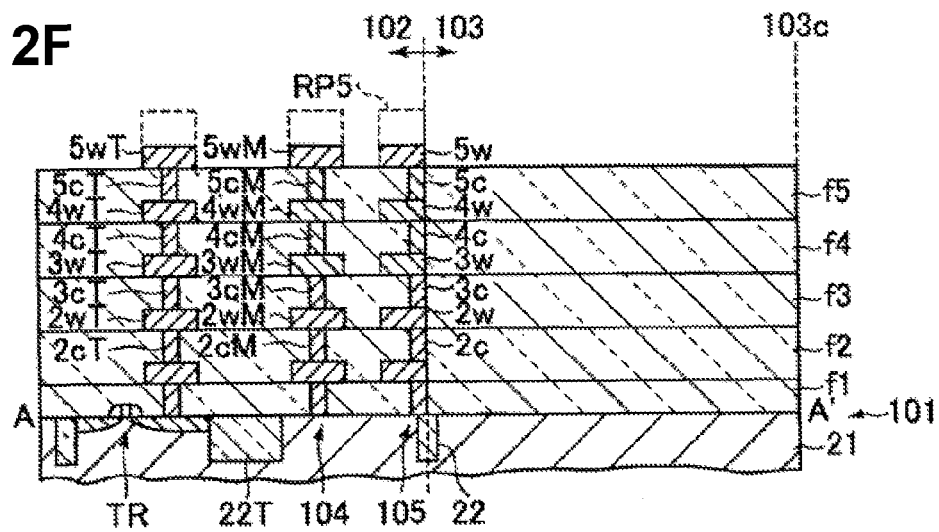
Figure 2G:
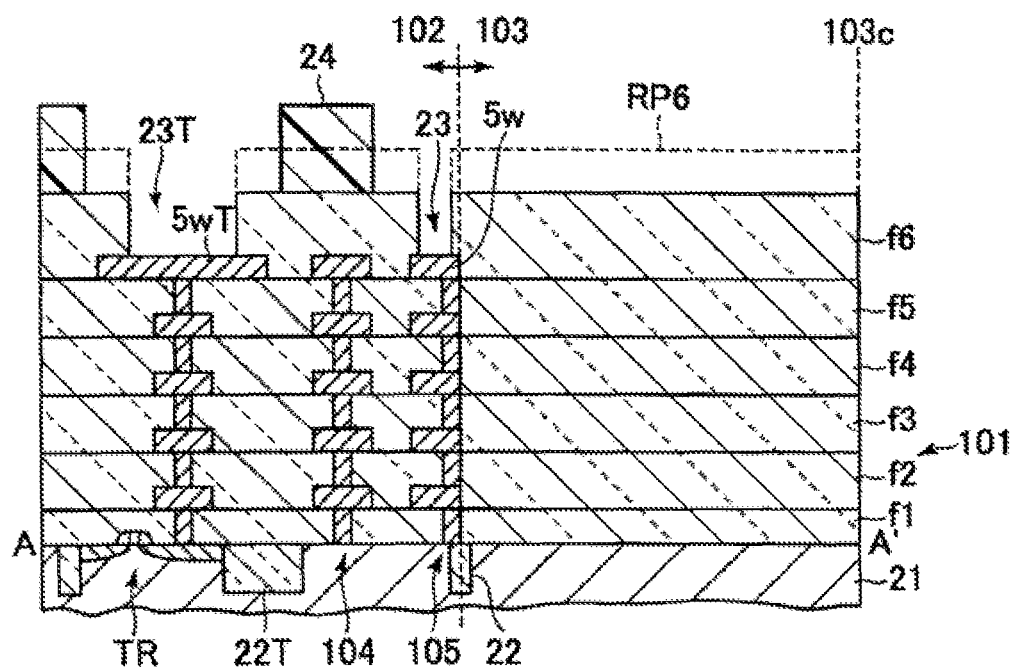

FIGS. 2A to 2G are schematic cross sectional views in a thickness direction illustrating main manufacture processes for a semiconductor wafer 101 equipped with the crack guard ring structure of the first embodiment. FIGS. 2A to 2G are cross sectional views of the semiconductor wafer taken along one-dot chain line AA' (i.e., from a portion of a transistor TR in the semiconductor chip area 102 to the scribe center 103c. FIG. 2G illustrates a finished state of the semiconductor wafer 101.

As will be described below, the moisture proof ring 104 and crack guard ring 105 are formed by using a process of forming multi-layer wirings to be connected to the transistor TR, i.e., by using a process of repetitively laminating a metal layer as a contact layer and a metal layer as a wiring layer.

Although the moisture proof ring 104 and crack guard ring 105 are not used as wirings, in the following description, for the purpose of description simplicity, each metal layer constituting the moisture proof ring 104 and crack guard ring 105 is also called a contact layer and a wiring layer in some cases. A recess in which a contact layer of the moisture proof ring 104 and crack guard ring 105 is to be buried is called a contact hole in some cases. The contact hole and a contact layer to be buried in the contact hole are represented by the same reference symbol.

In the following description, "T" is added to a reference symbol of a metal layer forming a wiring to be connected to the transistor TR, and "M" is added to a reference symbol of a metal layer forming the moisture proof ring 104, to distinguish from the metal layer forming the crack guard ring 105.

Reference is made to FIG. 2A. An element isolation insulating film 22T is formed in a silicon substrate (semiconductor substrate) 21, e.g., by shallow trench isolation (STI) to define an active region for a transistor TR. At the same time, by using the process of forming the element isolation insulating film 22T, a crack guard insulating film 22 is formed.

The crack guard insulating film 22 is formed as illustrated in FIG. 2G in an area lower than the crack guard ring 105 (as will be later described, the area is not limited just under the crack guard ring but, in an area lower in a height direction), and surrounds the semiconductor element such as transistor TR (as viewed in plan), similar to the crack guard ring 105. For the purpose of description, the end of the crack guard ring 105 on the side of the scribe region 103 is set to the border between the semiconductor chip area 102 and scribe area 103.

Reverting to FIG. 2A, description will continue. A thickness of the crack guard insulating film 22 to be formed by STI (a depth of a trench formed in the substrate 21 in which the crack guard insulating film 22 is buried is equal to a depth of the element isolation insulating film 22T, and e.g., about 320 nm. A width of the crack guard insulating film 22 is e.g., about 1 micrometer.

After the element isolation insulating film 22T and crack guard insulating film 22 are formed, a transistor TR is formed. Heretofore known techniques may be used properly for forming the transistor TR.

Reference is made to FIG. 2B. A first interlayer insulating film f1 is formed on the silicon substrate 21, covering the transistor TR. For example, the first interlayer insulating film f1 is formed in the following manner. A silicon oxide film is deposited on the silicon substrate 21 to a thickness of about 20 nm. A silicon nitride film is deposited on the silicon oxide film to a thickness of about 80 nm. A boron phosphorous silicate glass (BPSG) film is deposited on the silicon nitride film to a thickness of about 1300 nm, or a silicon oxide film of tetraethoxy silane (TEOS) is deposited to a thickness of about 1000 nm. It is preferable to perform anneal for a BPSG film at 650° C. for about 120 seconds.

An upper surface of the BPSG film or the silicon oxide film of TEOS is planarized by chemical mechanical polishing (CMP), and thereafter a silicon oxide film is deposited to a thickness of about 100 nm to form the first interlayer insulating film f1. Each film constituting the first interlayer insulating film f1 is deposited, e.g., by chemical vapor deposition (CVD). A thickness of the first interlayer insulating film f1 is, e.g., about 950 nm.

Next, a resist pattern RP1 is formed on the first interlayer insulating film f1 by photolithography, the resist pattern RP1 having openings of the shapes corresponding to a first contact layer 1cT for a wiring to be connected to a drain/source region of the transistor TR, a first contact layer (lowermost metal layer) 1cM for the moisture proof ring 104, and a first contact layer (lowermost metal layer) 1c for the crack guard ring 105.

By using the resist pattern RP1 as a mask, the first interlayer insulating film f1 is etched to form contact holes 1cT, 1cM and 1c. After the contact holes 1a, 1cM and 1c are formed, the resist pattern RP1 is removed.

A width of the contact hole, i.e., a width of the first contact layer 1cM for the moisture proof ring 104 to be buried therein, is e.g., about 0.25 micrometer. A width of the contact hole 1c, i.e., a width of the first contact layer 1c of the crack guard ring 105 to be buried therein is about 0.25 micrometer, similar to a width of, e.g., the first contact layer 1cM for the moisture proof ring 104. In the following description, a width of the contact hole and a width of the contact layer will be described without discriminating both the widths in some cases. A width of the contact layer for the crack guard ring 105 is not necessary to be coincident with a width of the contact layer for the moisture proof ring. In the description, coincident widths are used by way of example.

The first contact layer 1c of the crack guard ring 105 is formed along the border of the semiconductor chip area 102, and surrounds the semiconductor element such as a transistor TR. A wiring layer such as a first wiring layer 1c to be formed later above the first contact layer 1c and a contact layer such as a second contact layer 2c are also formed along the border of the semiconductor chip area 102, and surrounds the semiconductor element such as a transistor TR.

Reference is made to FIG. 2C. A Ti/TiN/W lamination film is formed on the first interlayer insulating film f1, covering the inner surfaces of the contact holes 1a, 1cM and 1c. This notation of the lamination film means that the leftmost material film is formed on the lowermost side (substrate side). The Ti film of the Ti/TiN/W is deposited by sputtering to a thickness of, e.g., about 30 nm, and the TiN film is deposited by sputtering to a thickness of, e.g., about 20 nm. The W film is deposited by CVD to a thickness of, e.g., about 300 nm.

Next, an unnecessary portion of the Ti/TiN/W lamination film is removed by CMP to expose the upper surface of the first interlayer insulating film f1 and leave first contact layers 1cT, 1cM and 1c in the contact holes 1cT, 1cM and 1c, respectively.

The first contact layer 1c for the crack guard ring 105 is disposed, (for example) on the crack guard insulating film 22. In the example illustrate in FIG. 2C, although the first contact layer 1c partially overlaps the crack guard insulating film 22 as viewed in plan, the whole of the first contact layer may overlap the crack guard insulating film (i.e., the first contact layer 1c is included in the width of the crack guard insulating film 22). Further, as will be later described, the first contact layer 1c may be disposed not overlapping the crack guard insulating film 22 (the end of the first contact layer 1c on the scribe area 103 side is coincide with the end of the crack guard insulating film 22 on the semiconductor chip area 102 side, or disposed on the semiconductor chip area 102 side).

The crack guard insulating film 22 is disposed in such a manner that the end of the crack guard insulating film 22 on the scribed area 103 side is positioned on the scribe area 103 side relative to the end of the first contact layer 1c (the lowermost layer of the crack guard ring 105) on the scribe area 103 side.

Next, a Ti/TiN/Al/Ti/TiN lamination film is formed on the first interlayer insulating film f1, covering the first contact layers 1cT, 1cM and 1c. The Ti film under the Al film of the Ti/TiN/Al/Ti/TiN lamination film has a thickness of, e.g., about 60 nm. The TiN film under the Al film has a thickness of, e.g., about 30 nm. The Al film has a thickness of, e.g., about 360 nm, and the Ti film above the Al film has a thickness of, e.g., about 5 nm, and the TiN film above the Al film has a thickness of, e.g., about 70 nm (a total thickness is about 525 nm). Each film is deposited by sputtering.

Next, a resist pattern RP2 having the shapes of the first wiring layer 1wT, 1wM and 1w is formed on the Ti/TiN/Al/Ti/TiN lamination film by photolithography. By using the resist pattern RP2 as a mask, the Ti/TiN/Al/Ti/TiN lamination film is etched to leave the first wiring layers 1wT, 1wM and 1w. Heretofore known aluminum wiring forming techniques may be used for etching and the like of the Ti/TiN/Al/Ti/TiN lamination film. After the first wiring layers 1wT, 1wM and 1w are formed, the resist pattern RP2 is removed.

A width of the first wiring layer 1wM of the moisture proof ring 104 is, e.g., 3 micrometers to 5 micrometers, and a width of the first wiring layer 1w of the crack guard ring 105 is, e.g., 1 micrometer to 4 micrometers (typically about 3 micrometers).

The first wiring layers 1wT, 1wM and 1w are disposed being superposed upon the first contact layer 1cT for the wiring, the first contact layer 1cM for the moisture proof ring 104, and the first contact layer 1c for the crack guard ring 105, respectively.

In the crack guard ring 105 of the first embodiment, it is desired that the first contact layer 1c and first wiring layer 1w are formed in such a manner that the ends on the scribe area 103 side are made just coincident with each other. The position of the end of the first contact layer 1c on the scribe area 103 side and the position of the end of the first wiring layer 1w on the scribe area 103 side are made coincide with each other on the design basis.

Reference is made to FIG. 2D. A second interlayer insulating film f2 is formed on the first interlayer insulating film f1, covering the first wiring layers 1wT, 1wM and 1w. The second interlayer insulating film is formed, for example, in the following manner. A silicon oxide film is deposited on the first interlayer insulating film f1 to a thickness of about 750 nm by CVD. On this silicon oxide film, a silicon oxide film of TEOS is deposited to a thickness of about 1100 nm by CVD. An upper surface of the silicon oxide film of TEOS is planarized by CMP to form the second interlayer insulating film f2. A thickness of the second interlayer insulating film is, e.g., about 1 micrometer. A thickness of the second interlayer insulating film f2 left on the first wiring layers 1wT, 1wM and 1w is, e.g., about 460 nm.

Next, a resist pattern RP3 is formed on the second interlayer insulating film f2 by photolithography. The resist pattern RP3 has opening of the shapes corresponding to the second contact layer 2cT for the wiring, the second contact layer 2cM for the moisture proof ring 104, and the second contact layer 2c for the crack guard ring 105.

By using the resist pattern RP3 as a mask, the second interlayer insulating film f2 is etched to form contact holes 2cT, 2cM and 2c. After the contact holes 2cT, 2cM and 2c are formed, the resist pattern RP3 is removed.

A width of the second contact layer 2cM for the moisture proof ring 104 and a width of the second contact layer 2c for the crack guard ring 105 are, e.g., about 0.25 micrometer similar to the widths of the first contact layers 1cM and 1c.

Reference is made to FIG. 2E. A Ti/TiN/W lamination film is formed on the second interlayer insulating film f2, covering the inner surfaces of the contact holes 2cT, 2cM and 2c. The Ti film of the Ti/TiN/W lamination film is deposited by sputtering to a thickness of, e.g., about 20 nm, and the TiN film is deposited by sputtering to a thickness of, e.g., about 40 nm. The W film is deposited by CVD to a thickness of e.g., about 300 nm.

Next, an unnecessary portion of the Ti/TiN/W lamination film is removed by CMP to expose the second interlayer insulating film f2 and leave second contact layers 2cT, 2cM and 2c in the contact holes 2cT, 2cM and 2c.

The second contact layer 2c is disposed being superposed upon the first wiring layer 1w. In the crack guard ring 105 of the first embodiment, it is desired that the first wiring layer 1w and second contact layer 2c are formed in such a manner that the ends of the first wiring layer 1w and second contact layer 2c on the scribe area 103 side are just coincide with each other. The position of the end of the wiring layer 1w on the scribe area 103 side and the position of the end of the contact hole 2c in which the second contact layer 2c is buried are made coincide with each other on the design basis.

In the crack guard ring 105 of the first embodiment, contact layers and wiring layers to be formed at upper layers are also formed in such a manner that the ends on the scribe area 103 side are just coincide with each other. Namely, in the crack guard ring 105 of the first embodiment, the contact layers and wiring layers are formed so that the side walls on the scribe area 103 side are made smooth.

Next, a Ti/TiN/Al/Ti/TiN lamination film is formed on the second interlayer insulating film f2, covering the second contact layer 2cT, 2cM and 2c. The Ti/TiN/Al/Ti/TiN lamination film is formed in a manner similar to the process of forming the Ti/TiN/Al/Ti/TiN lamination film on the first interlayer insulating film f1.

Next, a resist pattern RP4 is formed on the Ti/TiN/Al/Ti/TiN lamination film by photolithography, the resist pattern PR4 having the shapes corresponding to the second wiring layer 2wT, 2wM, and 2w. By using the resist pattern RP4 as a mask, the Ti/TiN/Al/Ti/TiN lamination film is etched to leave second wiring layers 2wT, 2wM and 2w. After the second wiring layers 2wT, 2wM and 2w are formed, the resist pattern RP4 is removed.

Widths of the second wiring layer 2wM of the moisture proof ring 104 and the second wiring layer 2w of the crack guard ring 105 are, e.g., similar to those of the first wiring layer 1wM and 1w. Further, as described earlier, the second wiring layer 2w of the crack guard ring 105 and the second contact layer 2c are formed in such a manner that the ends on the scribe area 103 side are made coincident with each other.

Reference is made to FIG. 2F. The process similar to the process of forming the first wiring layers 1wT, 1wM and 1w, and forming the second interlayer insulating film f2 covering the first wiring layers 1wT, 1wM and 1w, and further forming the second contact layers 2cT, 2cM and 2c in the second interlayer insulating film, is repeated to form a multi-layer wiring and the moisture proof ring 104 and crack guard ring 105. In the example illustrated in FIG. 2F, as the uppermost contact layer, the fifth contact layers 5a, 5cM and 5c in the fifth interlayer insulating film f5 are formed.

The widths and heights of third to fifth contact layers 3cM to 5cM of the moisture proof ring 104 are similar to the width and height of, e.g., the second contact layer 2cM. The widths and heights of third to fifth contact layers 3c to 5c of the crack guard ring 105 are similar to the width and height of, e.g., the second contact layer 2c.

The widths and heights of the third and fourth wiring layers 3wM and 4wM of the moisture proof ring 104 are similar to the widths and heights of, e.g., the first and second wiring layers 1wM and 2wM. The widths and heights of the third and fourth wiring layers 3w and 4w of the crack guard ring 105 are similar to the widths and heights of, e.g., the first and second wiring layers 1w and 2w.

Then a Ti/TiN/Al/TiN lamination film as the uppermost metal layer is formed on the fifth interlayer insulating film f5, covering the fifth contact layers 5cT, 5cM and 5c. The Ti film of the Ti/TiN/Al/TiN lamination film has a thickness of, e.g., about 60 nm, the Ti film under the Al film has a thickness of, e.g., about 30 nm, the Al film has a thickness of, e.g., about 700 nm, the Ti film above the Al film has a thickness of, e.g., about 70 nm (a total thickness is about 860 nm), each film being deposited by sputtering.

Next, a resist pattern RP5 is formed on the Ti/TiN/Al/TiN lamination film by photolithography, having the shapes corresponding to the fifth wiring layers 5wT, 5wM and 5w. By using the resist pattern RP5 as a mask, the Ti/TiN/Al/TiN lamination film is etched to leave fifth wiring layers 5wT, 5wM and 5w. After the fifth wiring layers 5wT, 5wM and 5w are formed, the resist pattern RP5 is removed.

A width of the fifth wiring layer 5wM of the moisture proof ring 104 is 3 micrometers to 5 micrometers similar to, e.g., the lower wiring layer 1wM. A width of the fifth wiring layer 5w of the crack guard ring 105 is 1 micrometer to 4 micrometers (typically about 3 micrometers) similar to, e.g., the lower wiring layer 1w.

The crack guard ring 105 of the first embodiment is formed in this manner by using the multi-layer wiring forming process (and the process of forming the moisture proof ring 104). As described above, the crack guard ring 105 of the first embodiment has a flat side wall on the scribe area 103 side.

The crack guard ring 105 is formed not to contact the moisture proof ring 104. Namely, the opposing wiring layer ends of the crack guard ring 105 and moisture proof ring 104 are disposed some space therebetween. A distance between the wiring layer end of the moisture proof ring 104 and the wiring layer end of the crack guard ring 105 is, e.g., about 1 micrometer (maximum about 5 micrometers).

Reference is made to FIG. 2G. A cover insulating film f6 is formed on the fifth interlayer insulating film f5, covering the fifth wiring layers 5wT, 5wM and 5w. The cover insulating film f6 is formed by depositing a silicon oxide film on the fifth interlayer insulating film f5 to a thickness of about 700 nm by CVD, and depositing silicon nitride on the silicon oxide film to a thickness of about 700 nm by CVD.

Next, a resist pattern RP6 is formed on the cover insulating film f6 by photolithography, the resist pattern RP6 having openings of the shapes corresponding to a contact window (pad window) 23T exposing the upper surface of the wiring layer 5wT of multi-layer wiring and a crack guard window 23 exposing the upper surface of the wiring layer 5w of the crack guard ring 105.

By using the resist pattern RP6 as a mask, the cover insulating film f6 is etched to form a contact window 23T and a crack guard window 23. After the contact window 23T and crack guard window 23 are formed, the resist pattern RP6 is removed.

The crack guard window 23 is formed by using the process of forming the wiring contact window 23T. Etching for forming the contact window 23T and crack guard window 23 is performed by using mixture gas of, e.g., $CF_4$, $CHF_3$, Ar and the like. The contact window 23T is etched generally under the over etch condition. In the process of forming a crack guard window 23A of the second embodiment to be described later, a recess reaching an intermediate depth of the lamination insulating film is formed by using over etch.

The crack guard window 23 is formed above the crack guard ring 105 and along the border of the semiconductor chip area 102, and surrounds a semiconductor element such as a transistor TR. The crack guard window 23 separates the cover insulating film f6 covering the uppermost metal layer 5w of the crack guard ring 105 into a portion on the semiconductor chip area 102 side and on the scribe area 103 side.

A width of the crack guard window is, e.g., 1 micrometer to 2 micrometers (typically 1.5 micrometers). The crack guard window 23 of the first embodiment is disposed so that its width is included in a width of the wiring layer 5w of the crack guard ring 105. Namely, although a portion of the upper surface of the wiring layer 5w is exposed on the bottom of the crack guard window 23, the cover insulating film f6, underlying interlayer insulating film and the like are not exposed.

If necessary, an insulating film 24 of polyimide or the like is formed on the cover insulating film f6. The insulating film 24 exposes the contact window 23T, and is formed having a pattern not extending toward the scribe area 103 side more than the moisture proof ring 104. Namely, the insulating film 24 does not overlap the crack guard window 23.

The semiconductor wafer 101 equipped with the crack guard ring structure of the first embodiment is formed in the manner described above. The number of multi-layer wirings, i.e., the number of metal layers constituting the crack guard ring may be changed properly depending upon the kind of a semiconductor chip.

Figure 3:
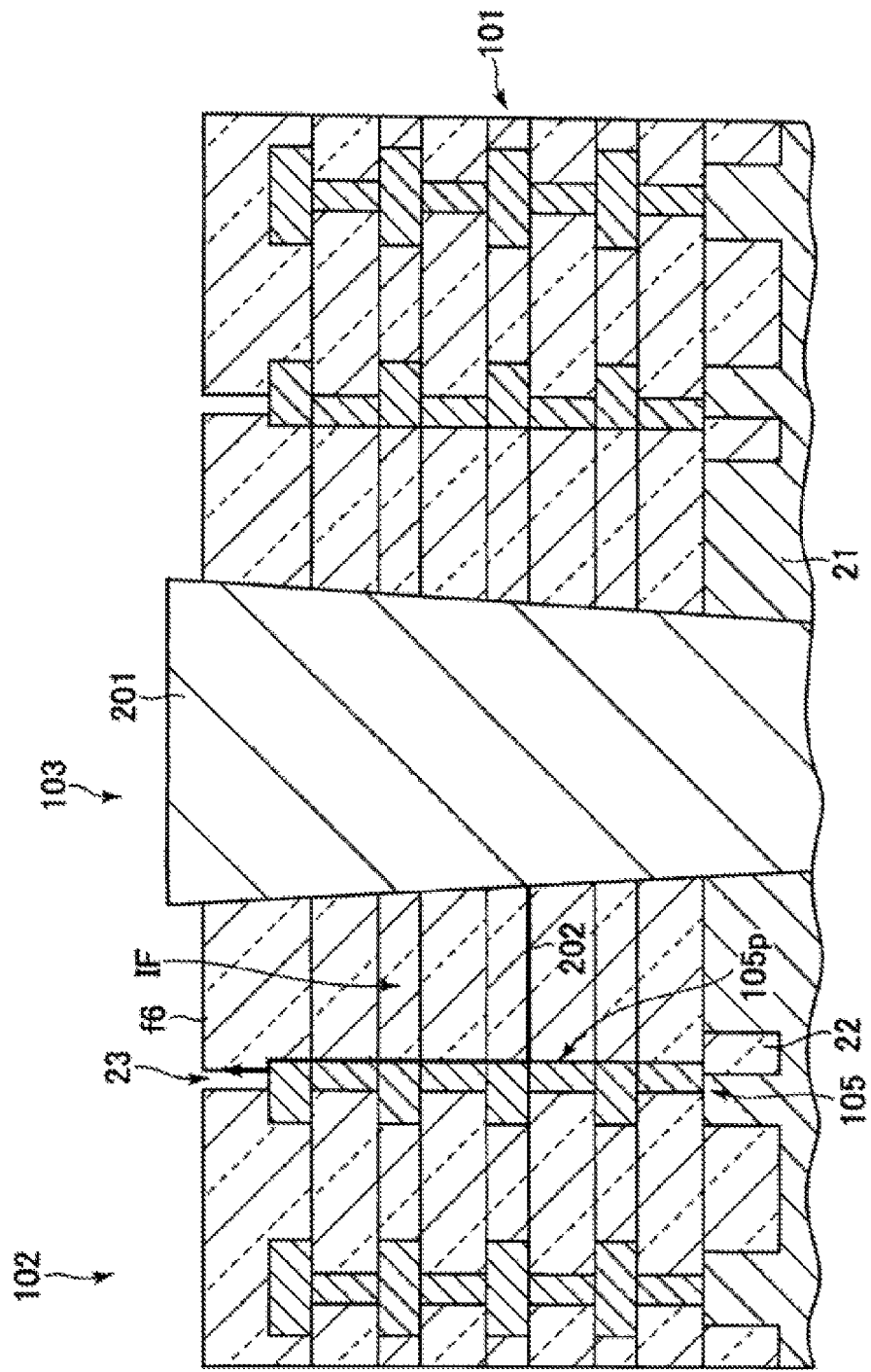
FIG. 3 is a schematic cross sectional view in a thickness direction illustrating the state of cutting a semiconductor wafer equipped with a crack guard ring structure of the first embodiment with a dicing saw (wherein a crack propagates along an interface of an interlayer insulating film).
Figure 4:
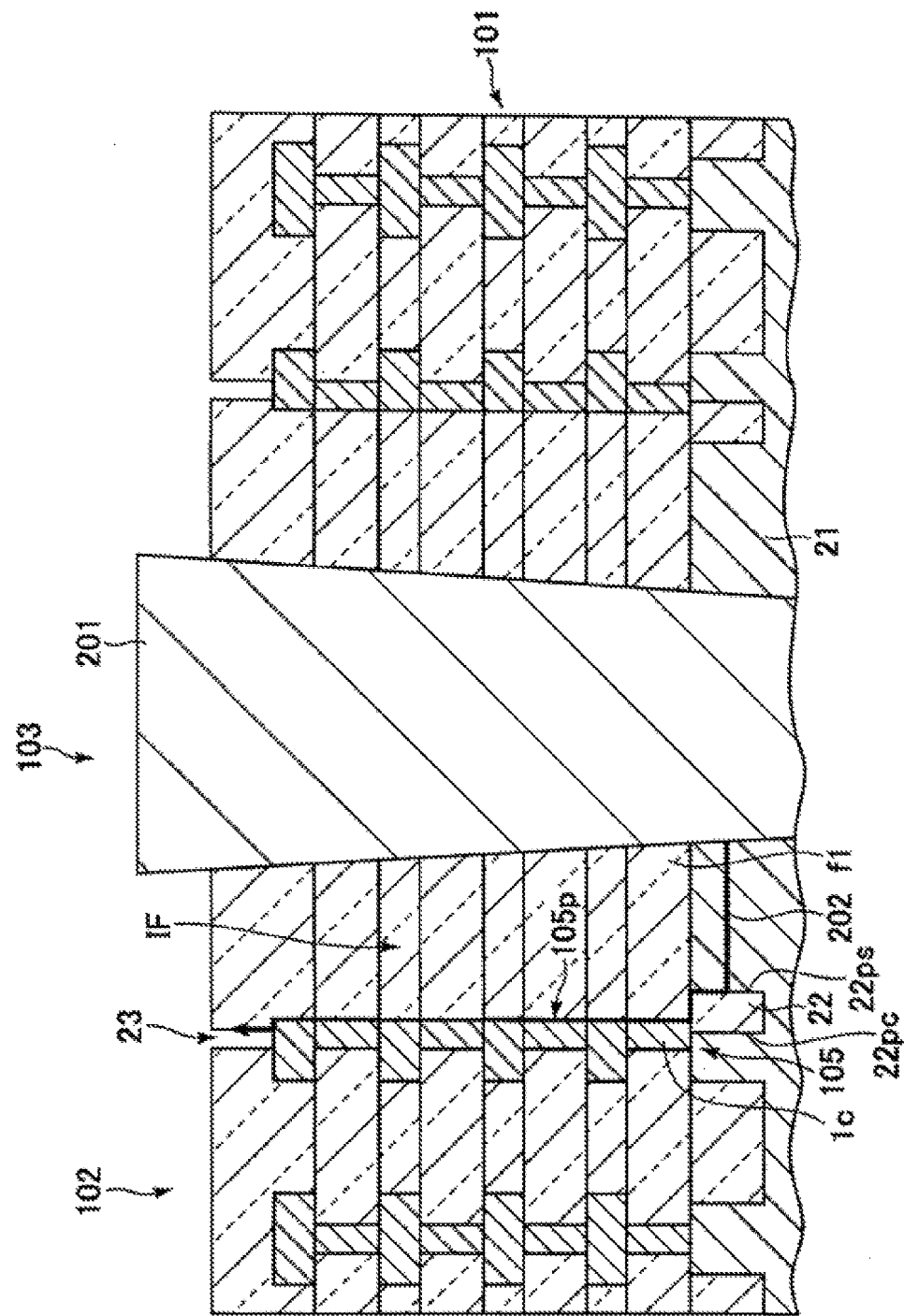
FIG. 4 is a schematic cross sectional view in a thickness direction illustrating the state of cutting a semiconductor wafer equipped with a crack guard ring structure of the embodiment with a dicing saw (wherein a crack propagates in a substrate).

With reference to FIGS. 3 and 4, description will be made on the function of the crack guard ring structure of the first embodiment. FIGS. 3 and 4 are schematic cross sectional views in a thickness direction illustrating the state that a semiconductor wafer equipped with the crack guard ring structure of the first embodiment is cut with a dicing saw.

FIG. 3 illustrate a case wherein a crack 202 propagates from near a dicing saw 201 toward the semiconductor chip area 102 along the interface between laminated interlayer insulating films. A propagation route of the crack 202 is indicated by an arrow.

A crack formed near the dicing saw and propagated laterally (in-plane direction) at a height in the lamination insulating film IF reaches the side wall 105p of the crack guard ling 105 on the scribe area 103 side. As the crack reaches the side wall 105p, a propagation direction of the crack 202 changes to a vertical direction (thickness direction), and the crack 202 propagates along the interface between the crack guard ring 105 and lamination insulating film IF (i.e., along the side wall 105p).

Since the side wall 105p of the crack guard ring 105 of the first embodiment is made smooth, the crack 202 is made propagate smoothly along the side wall 105p.

Consider a comparative example of a crack guard ring having a side wall of convex and concave shape in which the end of the wiring layer on the scribe area 103 side greatly projects towards the scribe area side more than the end of the contact layer on the scribe area side. As a crack propagates along the side wall of this crack guard ring, the crack changes the propagating direction along the convex and concave shape. A force that the crack pushes upward the eave portion of the wiring layer protruding from the contact layer is therefore generated. The wiring layer is therefore striped from the contact layer and the crack guard ring is likely to be broken. As the crack guard ring is broken, the crack propagates into the semiconductor chip area 102.

The smooth side wall 105p of the crack guard ring 105 of the first embodiment suppresses breakdown of the crack guard ring during crack propagation.

The crack 202 propagated along the side wall 105p arrives at the crack guard window 23 to be terminated. If the crack guard window 23 is not formed and an insulating film is left on the uppermost metal layer of the crack guard ring, the crack is likely to propagate along the interface between upper surface of the uppermost metal layer and the insulating film into the semiconductor chip area. The crack guard window 23 terminates the crack 202 at the top portion of the crack guard ring 105 to effectively suppress invasion of the crack 202 into the semiconductor chip area 102.

The cover insulating film f6 from the crack guard window 23 toward the scribe area 103 side covers the whole width of the scribe area 103 to planarize the upper surface of the scribe area 103. If an irregular structure (island structure) exists in the scribe area 103, a crack is likely to be formed when a dicing saw contacts the corner of the island structure. A crack is likely to be suppressed from being generated by planarizing the upper surface of the scribe area 103 by using the above-described structure.

FIG. 4 illustrates a case wherein a crack 202 propagates near from the dicing saw 201 toward the semiconductor chip area 102 via the substrate 21. A propagation route of the crack 202 is indicated by an arrow. There is a case wherein the crack 202 is generated in the substrate 21 as illustrated in FIG. 4, although an occurrence frequency of this case is smaller than the case wherein a crack is generated at the interface between the interlayer insulating films as illustrated in FIG. 3.

A crack 202 generated near the dicing saw 201 and propagated laterally at a height of the surface layer portion of the substrate 21 arrives at a side wall 22ps of the crack guard insulating film 22 on the scribe area 103 side. The crack 202 is likely to propagate thereafter along the interface between the substrate 21 and crack guard insulating film 22 on which a stress concentrates more than to propagate the inside of the crack guard insulating film 22.

The crack 202 propagated along the interface 22ps between the substrate 21 and crack guard insulating film 22 and arrived at the substrate surface, further propagates along the interface between the crack guard insulating film 22 and first interlayer insulating film f1 (along the upper surface of the crack guard insulating film 22), and arrives at the lowermost position of the side wall 105p of the crack guard ring 105. A propagation route after the crack 202 arrives at the side wall 105p is similar to the route described with reference to FIG. 3.

The end of the crack guard insulating film 22 on the scribe area 103 side is disposed on the scribe area 103 side more than the end of the lowermost metal layer 1c of the crack guard ring 105 on the scribe area 103 side. It is therefore possible to guide the crack propagated in the substrate 21 from the dicing saw 201 side to the side wall 105p of the crack guide ring 105 along the side wall and upper surface of the crack ring guard insulating film 22.

The crack guard insulating film 22 and crack guard ring 105 may not be superposed upon each other. Namely, the crack guard insulating film 22 may not be disposed just under the lowermost metal layer 1c of the crack guard ring 105.

In this case, the crack guard insulating film 22 is disposed displaced to the scribe area 103 side from the lowermost metal layer 1c of the crack guard ring 105 as viewed in plan. The end (side wall 22pc) of the crack guard insulating film 22 on the semiconductor chip area 102 side is also disposed to the scribe area 103 side spaced from the end of the metal layer 1c on the scribe area 103 side, similar to the end on the scribe area 103 side. Alternatively, the end of the crack guard insulating film 22 on the semiconductor chip area 102 side may be coincident with the end of the metal layer 1c on the scribe area 103 side.

With reference to FIG. 4, description has been made on a propagation route of the crack arrived at the side wall 22ps of the crack guard insulating film 22 on the scribe area 103 side and propagating upward to arrive at the substrate surface. Although it is considered an occurrence frequency is smaller than that of the above-described propagation route, another propagation route may be considered along which the crack arrived at the side wall 22ps of the crack guard insulating film 22 on the scribe area 103 side creeps under the crack guard insulating film 22 and arrives at the substrate surface via the side wall 22*pc* of the crack guard insulating film 22 on the semiconductor chip area 102 side.

In the layout that the crack guard insulating film 22 is positioned being displaced to the scribe area 103 side so as not to superpose upon the crack guard ring 105, the crack arrived at the substrate surface via the side wall 22*pc* of the guard insulating film 22 on the semiconductor chip area 102 side further propagates also along the interface between the substrate 21 and first interlayer insulating film f1 to be guided to the side wall 105*p* of the crack guard ring 105.

The crack guard insulating film 22 formed in a substrate depth direction allows the crack propagated in the substrate to be guided to the substrate upper surface along the interface with the substrate.

In order to narrow the width of the scribe area 103, it is desired to narrow a width of the crack guard ring structure. It is preferable from this viewpoint that the crack guard insulating film 22 and crack guard ring 105 are disposed being overlapped.

In addition to an insulating film formed by STI, an insulating film formed by local oxidation of silicon (LOCOS) may be used as the element isolation insulating film 22T and crack guard insulating film 22. However, it is considered that a possibility that a crack creeps under the crack guard insulating film 22 formed by LOCOS increases more than the crack guard insulating film formed by STI. It is supposed that the crack guard insulating film 22 is desired to be disposed being displaced to the scribe area 103 side so as not to superpose upon the crack guard ring 105.

As described above, the crack guard ring structure of the first embodiment suppresses a crack generated during cutting a semiconductor wafer from being propagated into the semiconductor chip area.

Figure 5:
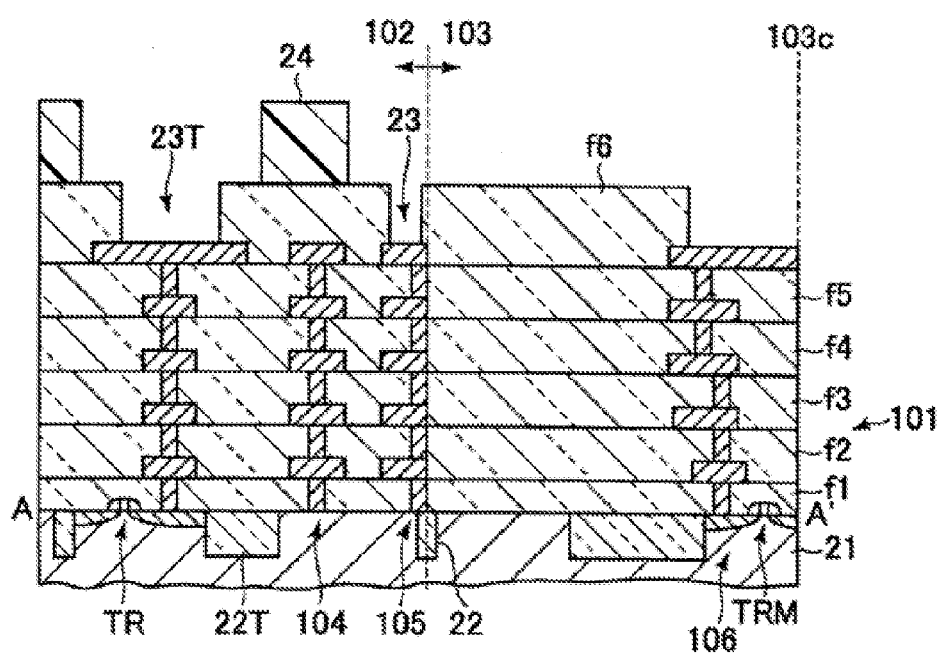
FIG. 5 is a schematic cross sectional view illustrating a semiconductor wafer according to a modification of the first embodiment.

FIG. 5 is a schematic cross sectional view illustrating a semiconductor wafer according to a modification of the first embodiment. In this modification, a monitor circuit 106 is formed in the scribe area 103, including a monitor transistor TRM and a multi-layer wiring connected to the transistor TRM. It is possible to form the monitor circuit 106 at the same time when circuits are formed in the semiconductor chip area 102. In order to improve flatness of the scribe area 103, a cover insulating film f6 is left in an area other than a contact window of the monitor circuit 106.

Next, with reference to FIGS. 6 and 7, a crack guard ring structure of the second embodiment will be described.

Figure 6:
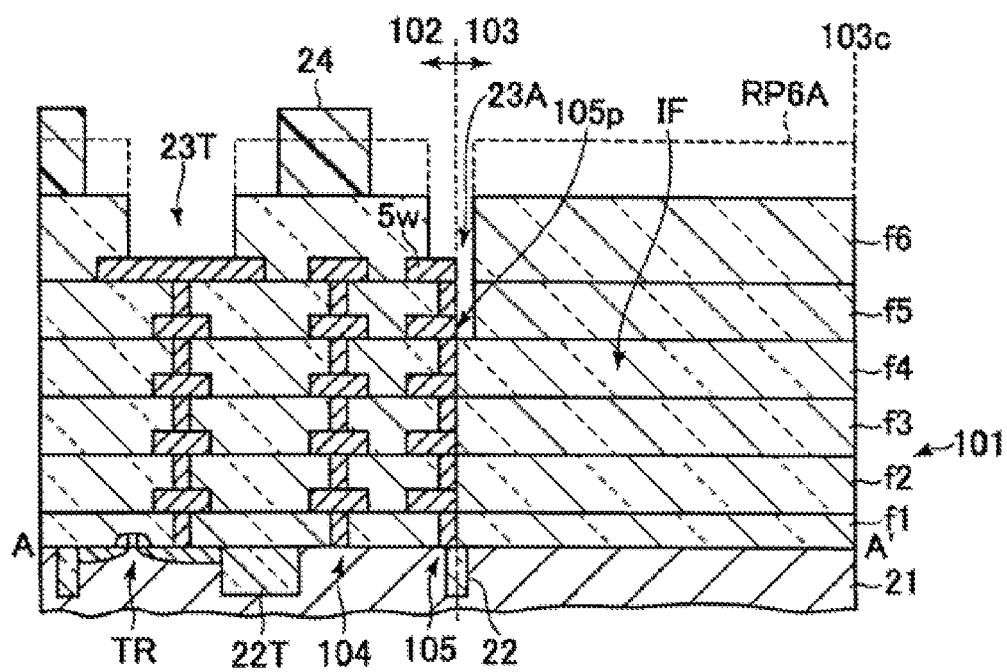
FIG. 6 is a schematic cross sectional view in a thickness direction illustrating a semiconductor wafer equipped with a crack guard ring structure of a second embodiment.

FIG. 6 is a schematic cross sectional view in a thickness direction illustrating a semiconductor wafer 101 equipped with a crack guard ring structure of the second embodiment. A plan layout of a whole semiconductor wafer 101 equipped with the crack guard ring structure of the second embodiment is similar to the first embodiment (refer to FIG. 1). A difference of the second embodiment from the first embodiment is the structure of a crack guard window. A wiring layer width of the crack guard ring is changed correspondingly.

A side wall of the crack guard window 23A of the second embodiment on the semiconductor chip area 102 side is disposed on the upper surface of the uppermost wring layer 5*w* of the crack guard ring 105, whereas the side wall on the scribe area 103 side is disposed being displaced from the upper surface of the uppermost wiring layer 5*w*. In this displaced portion, the bottom of the crack guard window 23A reaches an intermediate depth of a lamination insulating film IF, and the side wall 105*p* of the crack guard ring 105 is exposed in the trench of the crack guard window 23A.

Similar to the crack guard window 23 of the first embodiment, the crack guard window 23A of the second embodiment is able to be formed by using the etching process of forming the wiring contact window 23T. In the second embodiment, however, a resist pattern RP6A as an etching mask has a shape corresponding to the above-described structure of the crack guard window 23A. Namely, the resist pattern RP6A for defining the crack guard window 23A superposes upon the wiring layer 5*w* on the semiconductor chip 102 side and upon a cover insulating film f6 on the wiring layer 5*w* and underlying interlayer insulating film f5 and the like on the scribe area 103 side.

As described earlier, a wiring contact window 23T is generally etched under an over etch condition. In the second embodiment, in etching using the resist pattern RP6A as a mask, in an opening portion of the crack guard window 23A superposing upon the wiring layer 5*w*, the upper surface of the wiring layer 5*w* is exposed on the bottom, and the crack guard window 23A does not become deeper than the upper surface.

In an opening portion of the crack guard window 23A outside the wiring layer 5*w*, the lamination insulating film IF is etched deeper than the upper surface of the wiring layer 5*w*. In the example illustrated in FIG. 6, the cover insulating film f6 and fifth interlayer insulating film f5 are etched. In the second embodiment, the crack guard window 23A is formed in the manner described above, having a depth allowing the side wall 105*p* of the crack guard ring 105 to be exposed.

A width of the crack guard window 23A of the second embodiment is, e.g., about 1 micrometer to 3 micrometers (typically about 1.5 micrometers). A width of the crack guard window 23 of the first embodiment was, about 1 micrometer to 2 micrometers (typically about 1.5 micrometers).

In the first embodiment, a width of the uppermost wiring layer 5*w* of the crack guard ring 105 is formed wide, e.g., about 3 micrometers in order to make the crack guard window 23 be included in the width. In the second embodiment, since the crack guard window 23A is not required to be included in the width of the wiring layer 5*w*, the wiring layer 5*w* and the like are able to be formed thinner (narrower) than the first embodiment. A width of the wiring layer 5*w* (and underlying wiring layers 1*w* to 4*w*) of the second embodiment is, e.g., about 1 micrometer to 3 micrometers (typically about 1.5 micrometers).

Figure 7:
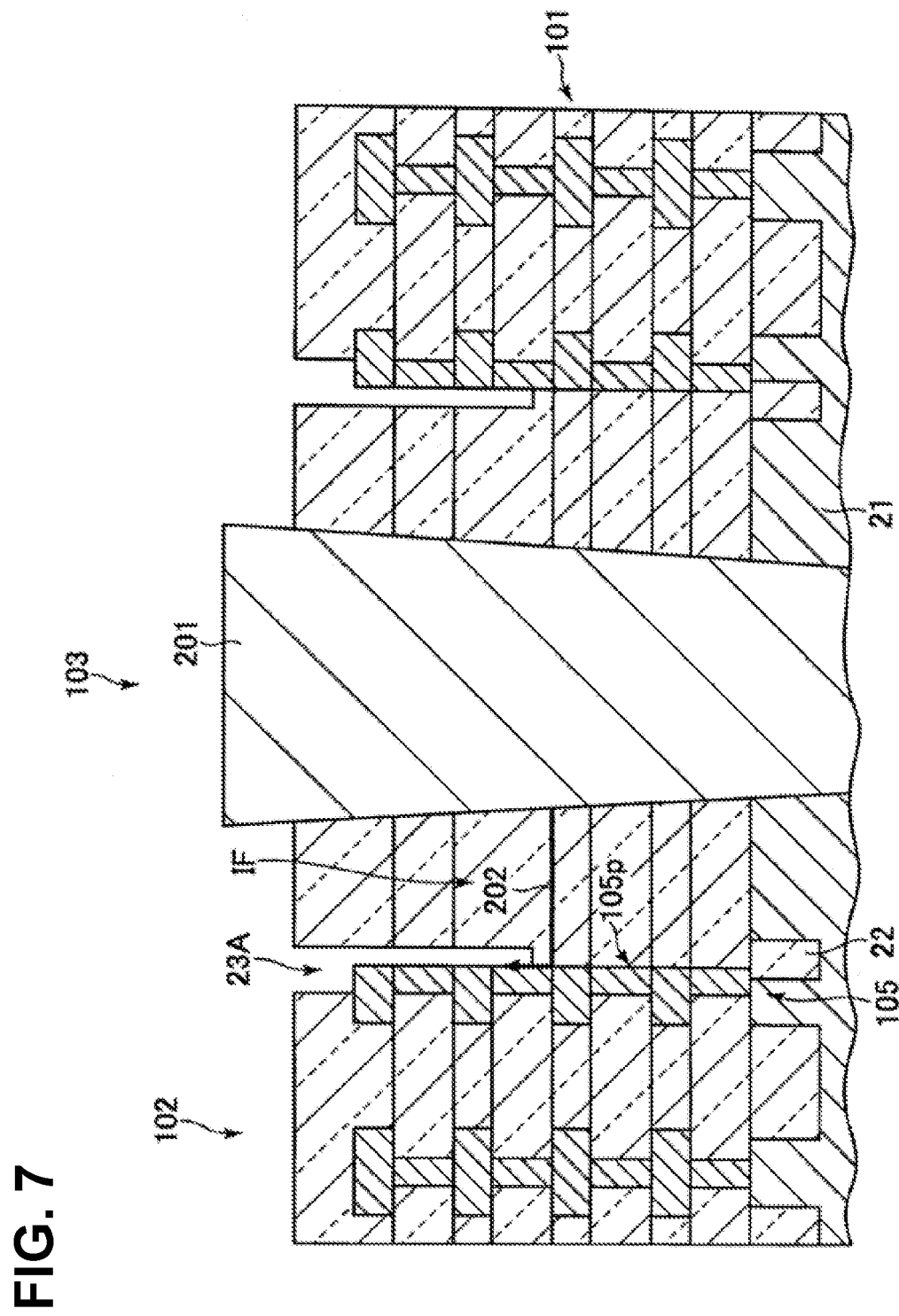
FIG. 7 is a schematic cross sectional view in a thickness direction illustrating the state of cutting a semiconductor wafer equipped with a crack guard ring structure of the second embodiment with a dicing saw.

FIG. 7 is a schematic cross sectional view in a thickness direction illustrating a state that a semiconductor wafer 101 equipped with the crack guard ring structure of the second embodiment is cut with a dicing saw 201. Similar to FIG. 3, in this state, a crack 202 propagates from near at the dicing saw 201 to the semiconductor chip area 102 along an interface between laminated interlayer insulating films. A propagation route of the crack 202 is indicated by an arrow.

In the crack guard ring structure of the second embodiment, the crack guard window 23A is formed deep so that the bottom of the crack guard window 23A reaches an intermediate height of the crack guard ring 105 and that the side wall 105*p* of the crack guard ring 105 is exposed in the crack guard window 23A.

It is therefore possible to shorten a propagation distance of a crack 202 propagating to the bottom of the crack guard window 23A along the side wall 105*p*. Namely, it is possible to terminate the crack earlier. Since the crack 202 is terminated at an intermediate height of the crack guard ring 105, danger of breaking the crack guard ring 105 is lowered. The crack guard ring structure of the second embodiment suppresses effectively invasion of a crack 202 into the semiconductor chip area 102.

The following modification of the second embodiment may be considered. The lamination insulating film IF in the scribe area 103 is preferably thin from the viewpoint of realizing easy chip division with a dicing saw. As the position of the side wall of the crack guard window 23A on the scribe area 103 side is displaced to the scribe center side to widen an opening width, opposing crack guard windows 23A of the crack guard ring structures sandwiching the scribe area 103 are made continuous. The crack guard windows 23A of this structure allow the lamination insulating film IF left in the scribe area 103 to be made thin, and chip division becomes easy. In forming the crack guard windows 23A of this structure, etching is performed by using a resist pattern having a shape corresponding to the crack guard windows 23A.

Next, description will be made on a crack guard ring structure of the third embodiment by referring to FIGS. 8 and 9.

Figure 8:
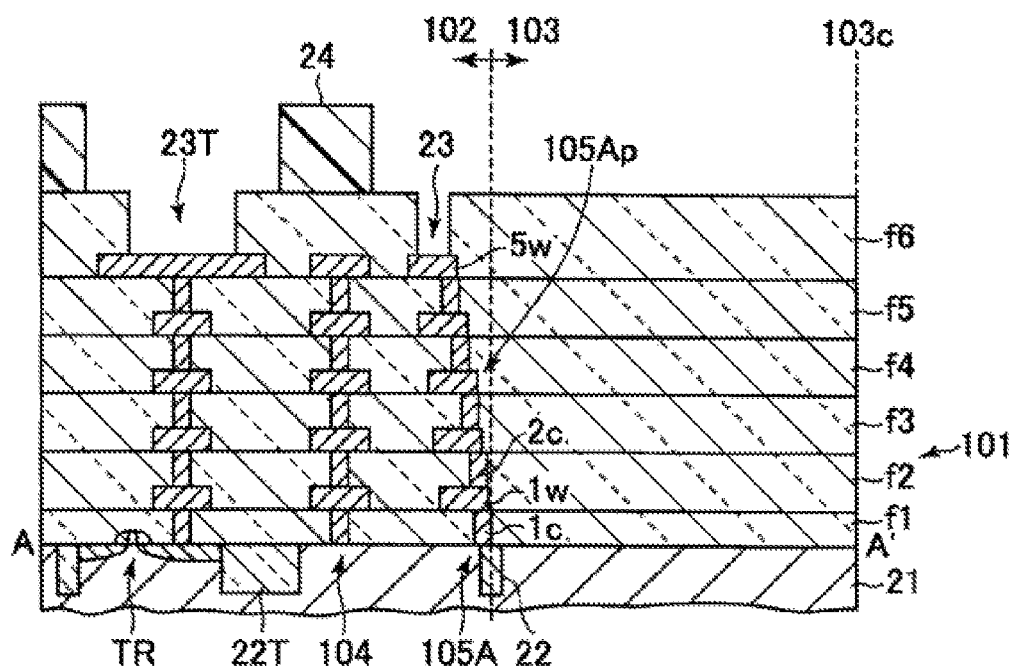
FIG. 8 is a schematic cross sectional view in a thickness direction illustrating a semiconductor wafer equipped with a crack guard ring structure of a third embodiment.

FIG. 8 is a schematic cross sectional view in a thickness direction illustrating a semiconductor wafer 101 equipped with a crack guard ring structure of the third embodiment. A plan layout of a whole semiconductor wafer 101 equipped with the crack guard ring structure of the third embodiment is similar to the first embodiment (refer to FIG. 1). A difference of the third embodiment from the first embodiment is the structure of a crack guard ring.

In the crack guard ring 105 of the first embodiment, the side wall 105p on the scribe area 103 side was formed as a smooth plane (a plane perpendicular to the substrate surface). In a crack guard ring 105A of the third embodiment, the side wall 105Ap on the scribe area 103 side is formed stepwise, and inclined as a whole, the upper portion becoming nearer to the semiconductor chip 102 side.

Similar to the crack guard ring 105 of the first embodiment, a crack guard ring 105A of the third embodiment is also formed by using a multi-layer wiring forming process. In the crack guard ring 105A of the third embodiment, however, metal layers are sequentially laminated in such a manner that an end of an upper metal layer, on the scribe area 103 side, to be superposed upon a lower metal layer is retracted to the semiconductor chip area 102 side.

More specifically, the first embodiment is partially modified and the crack guard ring 105A of the third embodiment is formed in the following manner. The widths and heights of the first to fifth contact layers 1c to 5c of the crack guard ring 105A and first wiring layers 1w to 5w are set similar to those of the crack guard ring 105 of the first embodiment. For example, the widths of the first to fifth contact layers 1c to 5c are 0.25 micrometer, and the widths of the first to fifth wiring layers 1w to 5w are 3 micrometers.

First contact layers 1c are formed in a first interlayer insulating film f1 in a manner similar to the first embodiment. A first wiring layer 1w to be superposed upon the first contact layer 1c is formed in such a manner that the end of the first wiring layer on the scribe area 103 side is displaced to the semiconductor chip area 102 side by a displacement width of a half (e.g., about 0.13 micrometer or narrower) of a width of the first contact layer 1c at the maximum from the end of the first contact layer 1c on the scribe area 103 side.

Further, a second contact layer 2c to be superposed upon the first wiring layer 1w is formed in such a manner that the end of the second contact layer on the scribe area 103 side is displaced to the semiconductor chip area 102 side by a displacement width of a half (e.g., about 0.13 micrometer or narrower) of a width of the second contact layer 2c at the maximum from the end of the first wiring layer 1w on the scribe area 103 side. Contact holes 2c for burying the second contact layers 2c are formed to realize this layout.

Thereafter, wiring layers on the contact layers and contact layers on the wiring layers are laminated by displacing the ends on the scribe area 103 side to the semiconductor chip area 102 side to form the crack guard ring 105A of the third embodiment.

In the crack guard ring 105A of the third embodiment, an upper portion is displaced to the moisture proof ring 104 side more than the lower portion. If necessary, therefore, the lowermost contact layer 1c of the crack guard ring 105A of the third embodiment is disposed spaced apart from the moisture proof ring 104 more than the first embodiment. Further, the crack guard insulating film 22 is disposed in correspondence with the position of the contact layer 1c.

Similar to the first embodiment, in the crack guard ring structure of the third embodiment, the crack guard window 23 is formed in an area of the upper surface of the uppermost wiring layer 5w of the crack guard ring 105A.

The side wall 105p of the crack guard ring 105 of the first embodiment is designed to be smooth, and ideally to be perfectly flat. Some irregularity may be formed, however, on an actually formed side wall 105p because of various errors during manufacture processes.

As described as the comparative example of the first embodiment (with reference to FIG. 3), if the end portion of the upper metal layer superposed upon the lower metal layer has an eave portion greatly protruding toward the scribe area 103 side, the crack guard ring 105 is likely to be broken.

In the crack guard ring of the third embodiment, the side wall 105Ap of the crack guard ring 105A of the third embodiment on the scribe area 103 side was formed stepwise so that the upper portion thereof becomes nearer to the semiconductor chip area 102. Namely, the outer sidewall of the upper metal layer superposed upon the lower metal layer was disposed being retracted to the semiconductor chip area 102 side. Even if there are errors during manufacture processes, the eave portion is hard to be formed and the crack guard ring 105A is suppressed from being broken.

The crack guard ring 105 of the first embodiment having the vertical side wall 105p allows the width necessary for the crack guard ring to be narrowed more than the crack guard ring 105A of the third embodiment having the slanted side wall 105Ap.

Figure 9:
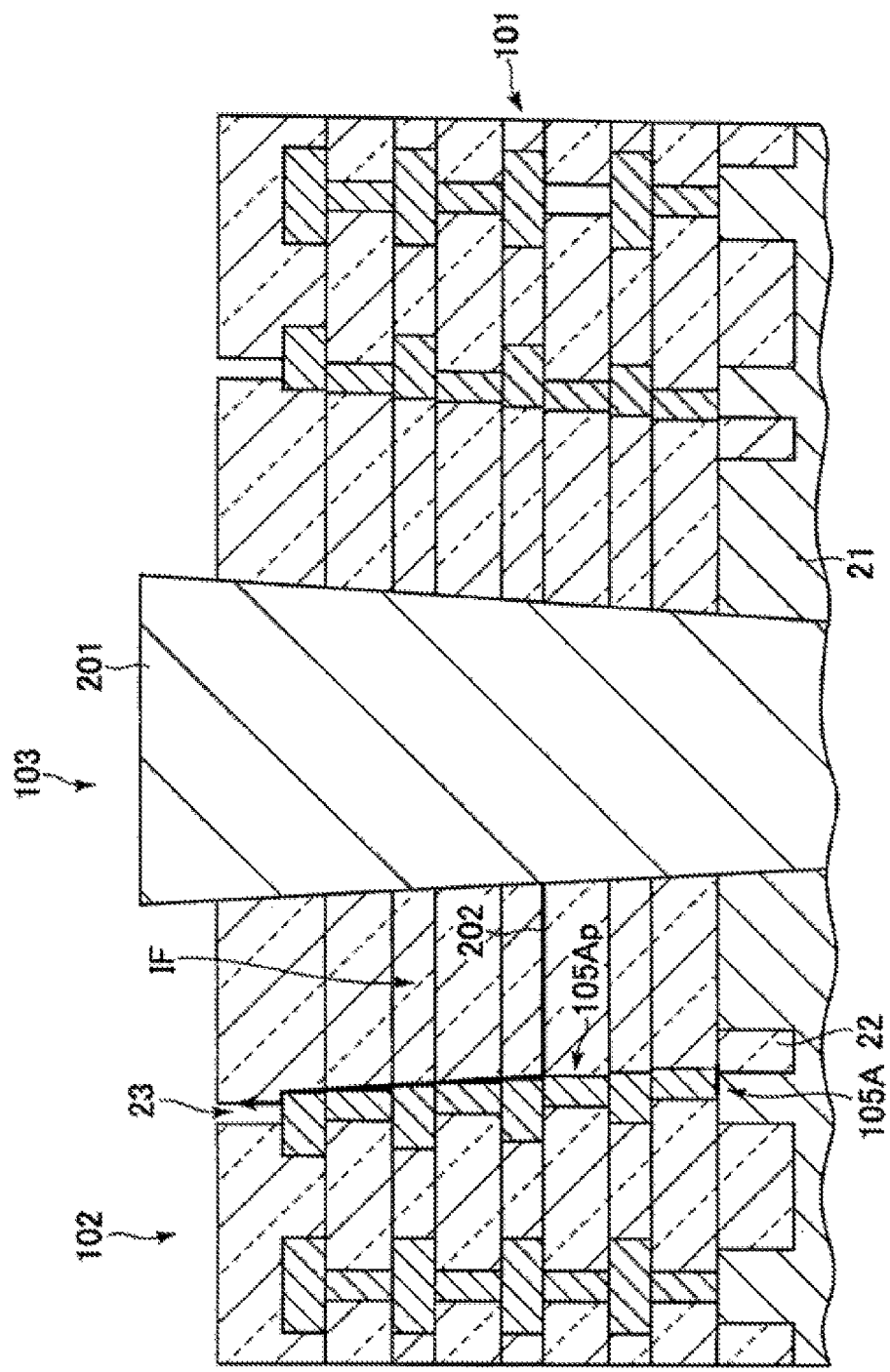
FIG. 9 is a schematic cross sectional view in a thickness direction illustrating the state of cutting a semiconductor wafer equipped with a crack guard ring structure of the third embodiment with a dicing saw.

FIG. 9 is a schematic cross sectional view in a thickness direction illustrating a state that a semiconductor wafer 101 equipped with the crack guard ring of the third embodiment is cut with a dicing saw 201. Similar to FIG. 3, in this state, a crack 202 propagates near from the dicing saw 201 to the semiconductor chip area 102 via an interface between laminated interlayer insulating films. A propagation route of the crack 202 is indicated by an arrow.

Also in the crack guard ring structure of the third embodiment, similar to the crack guard ring structure of the first embodiment, the crack 202 propagates along the side wall 105Ap of the crack guard ring 105A, and reaches the crack guard window 23 to be terminated. Invasion of the crack 202 into the semiconductor chip area 102 is suppressed in this manner.

Figure 10:
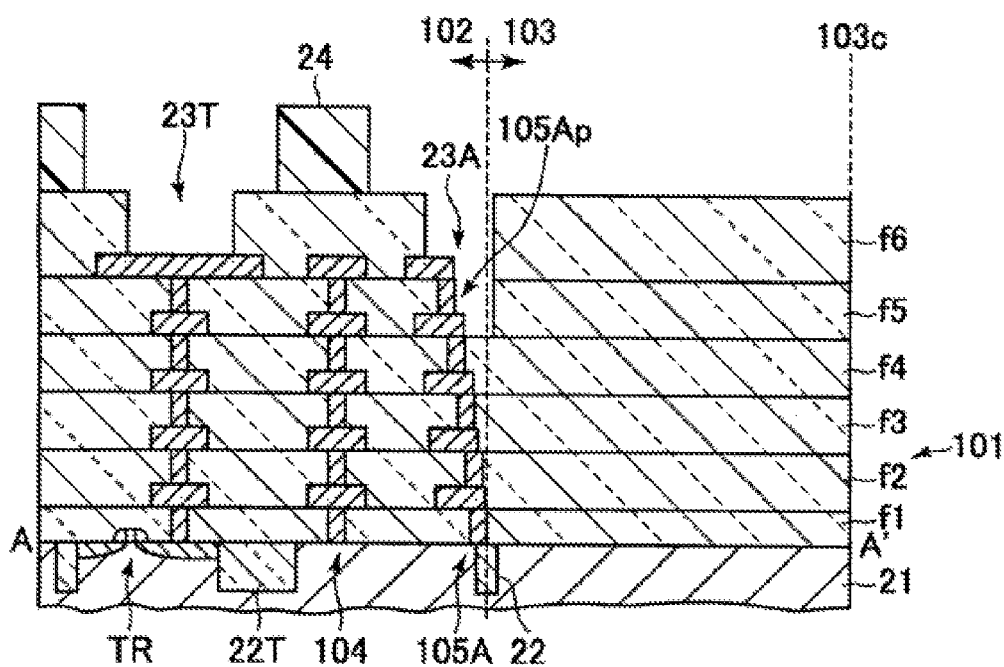
FIG. 10 is a schematic cross sectional view in a thickness direction illustrating a semiconductor wafer equipped with a crack guard ring structure of a fourth embodiment.

Next, with reference to FIG. 10, description will be made on the crack guard ring structure of the fourth embodiment. The fourth embodiment, as compared to the crack guard ring 105A having the inclined side wall 105Ap of the third embodiment, adopts the structure applying the crack guard window 23A having a depth exposing the side wall 105Ap of the crack guard ring 105A.

In the crack guard ring structure of the fourth embodiment, it is possible to form the crack guard ring 105A in the manner similar to the third embodiment, and the crack guard window 23A in the manner similar to the second embodiment. It is possible to narrow a width of a wiring layer of the crack guard ring 105A more than the third embodiment, as described in the second embodiment.

Since the side wall 105Ap is inclined to become nearer to the scribe area 103 as viewed downward, it is possible if necessary to widen the crack guard window 23A (the side wall of the crack guard window 23A on the scribe area 103 side is spaced apart toward the scribe area 103 side) to allow the bottom of the crack guard window 23A to reach to a sufficiently deep position (i.e., to sufficiently expose an upper portion of the side wall 105Ap).

The crack guard ring structure of the fourth embodiment is not likely to form an eave portion as described in the third embodiment, and also the crack is able to be terminated earlier as described in the second embodiment.

In the first to fourth embodiments, the crack guard ring structure is formed by using circuit manufacture techniques using aluminum wirings. As described in the fifth to ninth embodiments, it is possible to form the crack guard ring structure by using circuit manufacture techniques using copper wirings.

Next, with reference to FIGS. 11A to 11H, the crack guard ring structure of the fifth embodiment will be described. In order to avoid boresome reference symbol designation, reference symbols used for the first embodiment and the like regarding aluminum wirings are used in some cases in the fifth embodiment and the like regarding copper wirings.

The fifth embodiment corresponds to the first embodiment. Namely, the crack guard ring 105 having the smooth side wall 105p is formed by using a multi-layer wiring forming process using copper wirings. The crack guard window 23 is formed having a width included on the uppermost metal layer of the crack guard ring.

The whole plan layout of a semiconductor wafer 101 equipped with the crack guard ring structure of the fifth embodiment is similar to that of the first embodiment (refer to FIG. 1). FIGS. 11A to 11H are schematic cross sectional views in a thickness direction illustrating main manufacture processes for a semiconductor wafer 101 equipped with the crack guard ring structure of the fifth embodiment. FIG. 11H illustrates a finished state of the semiconductor wafer 101.

Figure 11A:
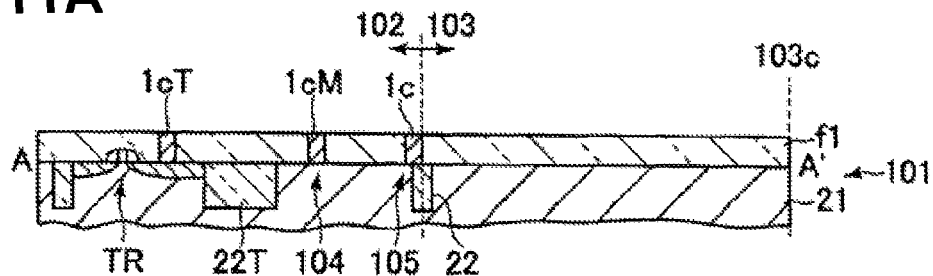
FIGS. 11A to 11H are schematic cross sectional views in a thickness direction illustrating main manufacture processes for a semiconductor wafer equipped with a crack guard ring structure of a fifth embodiment.

Reference is made to FIG. 11A. An element isolation insulating film 22T for defining transistor TR active regions and a crack guard insulating film 22 are formed in a silicon substrate 21 at the same time. After the element isolation insulating film 22T and crack guard insulating film 22 are formed, a transistor TR is formed in the silicon substrate 21. The transistor TR is formed by properly using heretofore known techniques.

Next, a first interlayer insulating film f1 is formed on the silicon substrate 21, covering the transistor TR. The first interlayer insulating film f1 is formed, e.g., in the following manner. A silicon nitride film is deposited on the silicon substrate 21 to a thickness of about 30 nm by CVD, and a phospho silicate glass (PSG) film is deposited on the silicon nitride film by CVD to a thickness of about 700 nm. The upper surface of the PSG film is planarized by CMP to form the first interlayer insulating film f1. A thickness of the first interlayer insulating film f1 is, e.g., about 450 nm.

Next, contact holes 1cT, 1cM, and 1c are formed through the first interlayer insulating film f1 for burying first contact layers for a wiring, a moisture proof ring 104 and a crack guard ring 105, respectively.

Widths of the first contact layer 1cM of the moisture proof ring 104 and the first contact layer 1c of the crack guard ring 105 are about 0.1 micrometer.

Next, a Ti/TiN/W lamination film is formed on the first interlayer insulating film, covering the inner surfaces of the contact holes 1cT, 1cM and 1c. The Ti film of the Ti/TiN/W lamination film has a thickness of about 10 nm, and the TiN film has a thickness of about 10 nm. Each film is formed by sputtering. The W film has a thickness of about 200 nm and is deposited by CVD.

Next, an unnecessary portion of the Ti/TiN/W lamination film is removed by CMP to expose the upper surface of the first interlayer insulating film f1 and leave the first contact layers 1cT, 1cM and 1c in the contact holes 1cT, 1cM and 1c.

Figure 11B:
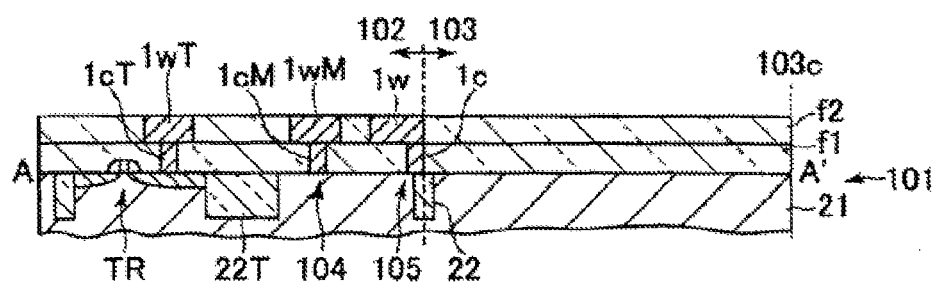

Reference is made to FIG. 11B. The first wiring layers 1wT, 1wM and 1w in the second interlayer insulating film f2 may be formed by well-known single damascene. More specifically, the first wiring layers are formed in the following manner.

Deposited are a silicon carbide (SiC) film (about 30 nm thick), a silicon oxide carbide (SiOC) film (about 130 nm thick), a silicon oxide film (about 100 nm thick) by TEOS, and a silicon nitride (SiN) film (about 30 nm thick). Resist (tri-level) is coated on the silicon nitride film. A silicon oxide film (about 100 nm thick) of TEOS is deposited on the resist (tri-level). A resist pattern having openings of wiring trench shapes corresponding to the first wiring layers 1w and the like is formed on the silicon oxide film.

By using the resist pattern as a mask, a hard mask is formed by using the silicon oxide film of TEOS just under the resist pattern. Next, the resist pattern is removed. At this time, the resist of tri-level in the openings is removed at the same time. By using the silicon oxide film of TEOS and the underlying tri-level resist as a mask, the silicon nitride film, silicon oxide film of TEOS, and silicon oxide carbide film are etched. This etching removes the hard mask of the silicon oxide film of TEOS and the underlying tri-level resist mask.

The silicon carbide film is removed at the same time when the silicon nitride film is etched to expose on the bottom of the wiring trench 1w and the like the underlying first contact layers 1c and the like. As the second interlayer insulating film layer f2 formed with the wiring trenches 1w and the like, a lamination portion of the silicon carbide film, silicon oxide carbide film and silicon oxide film of TEOS is left.

The recesses for burying the wiring layers for the moisture proof ring 104 and crack guard ring 105 are also called wiring trenches similar to the recesses for burying wiring layers of multi-layer wirings. The wiring trench and wiring layer to be buried therein are represented by the same reference symbol.

A width of the wiring trench 1wM, i.e., a width of the first wiring layer 1wM for the moisture proof ring 104 to be buried is, e.g., about 4 micrometers. A width of the wiring trench 1w, i.e., a width of the first wiring layer 1w for the crack guard ring 105 to be buried is, e.g., about 3 micrometers. A width of the wiring trench and a width of a wiring layer will be described in some cases without discrimination therebetween.

Similar to the first embodiment, an end of the first wiring layer 1w (i.e., the wiring trench 1w) of the crack guard ring 105 is formed coincident with the first contact layer 1c on the scribe area 103 side.

Next, a barrier metal film, e.g., a Ta film is deposited by sputtering on the second interlayer insulating film f2, covering the inner surfaces of the first wiring trenches 1wT, 1wM and 1w, a copper seed layer is deposited on the barrier metal film by sputtering. A copper film is electrolytic-plated on the seed film.

An unnecessary portion of the copper film, seed layer and barrier metal film is removed by CMP to expose the upper surface of the second interlayer insulating film f2 and leave the first wiring layers 1wT, 1wM and 1w in the wiring trenches 1wT, 1wM and 1w, respectively.

Figure 11C:
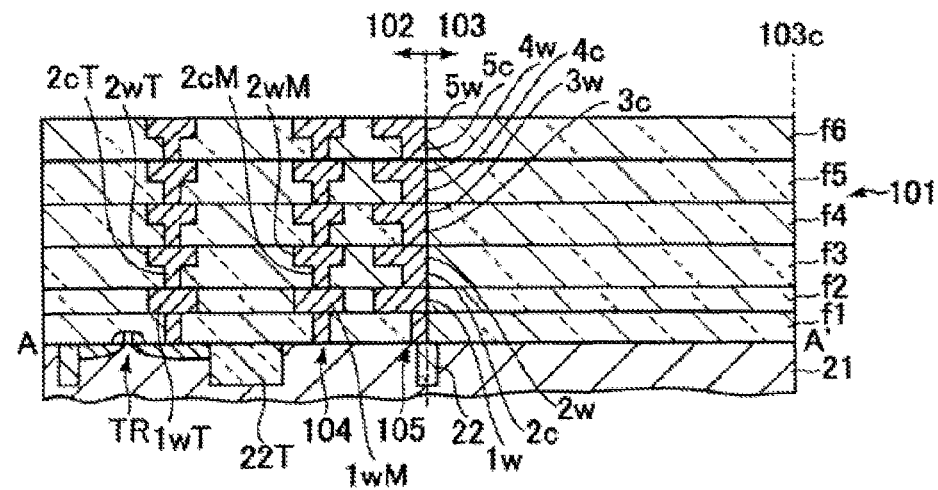

Reference is made to FIG. 11C. It is possible to form second contact layers 2cT, 2cM and 2c and second wiring layers 2wT, 2wM and 2w in the third interlayer insulating film f3 by well-known dual damascene, more specifically in the following manner.

Deposited are a silicon carbide film (about 60 nm thick), an silicon oxide carbide film (about 450 nm thick), a silicon oxide film (about 100 nm) of TEOS, and a silicon nitride film (about 30 nm thick). A resist pattern having openings of contact hole shapes corresponding to the second contact layers 2c and the like is formed on the silicon nitride film. By using this resist pattern as a mask, the silicon nitride film, silicon oxide film of TEOS and silicon oxide carbide film are etched.

After the resist pattern is removed, resist (tri-level) is coated, and a silicon oxide film (about 140 nm thick) of TEOS is deposited. A resist pattern having openings of wiring trench shapes corresponding to the second wiring layers 2w and the like is formed on the silicon oxide film. By using the resist pattern as a mask, a hard mask is formed by the silicon oxide film of TEOS just under the resist pattern. Next, the resist pattern is removed. In this case, the resist of tri-level in the openings is removed at the same time. By using the silicon oxide film of TEOS and underlying resist of tri-level as a mask, the silicon nitride film, silicon oxide film of TEOS and a partial thickness of the silicon oxide carbide film are etched to form the wiring trenches 2w and the like. This etching removes the hard mask of the silicon oxide film of TEOS and the underlying tri-level resist mask.

The silicon carbide film is removed at the same time when the silicon nitride film is etched to expose on the bottom of the contact holes 2c and the like the underlying first contact layers 1w and the like. As the third interlayer insulating film f3 formed with the second contact layers 2c and the like and second wiring layers 2w and the like, a lamination portion of the silicon carbide film, silicon oxide carbide film and silicon oxide film of TEOS is left.

The second contact layer 2c and second wiring layer 2w of the crack guard ring 105 are formed with the ends thereof being made coincident with the end of the first wiring layer 1w on the scribe area 103 side. Namely, the contact holes 2c and wiring trenches 2w are formed at the corresponding positions. Similar to the first embodiment, the upper contact layers and wiring layers are formed with the ends thereof on the scribe area 103 side being made coincident with each other so that the side wall on the scribe area 103 side is made smooth.

A depth of each of the wiring trenches 2wT, 2wM and 2w from the upper surface of the third interlayer insulating film f3 is, e.g., about a half of a thickness of the silicon oxide carbide film and a thickness of the silicon oxide film of TEOS, and about 275 nm. A height of the contact holes 2cT, 2cM and 2c is, e.g., about 335 nm correspondingly.

A width of each of the second contact layers 2cM and 2c of the moisture proof ring 104 and crack guard ring 105 is, e.g., about 0.13 micrometer. A width of the second wiring layer 2wM of the moisture proof ring 104 is, e.g., about 4 micrometers similar to the first wiring layer 1wM. A width of the second wiring layer 2w of the crack guard ring 105 is, e.g., about 3 micrometers similar to the first wiring layer 1w. A width of the third wiring layer and upper wiring layers of the moisture proof ring 104 and crack guard ring 105 is the same.

In these techniques, although the contact holes are formed first and then wiring trenches are formed by way of example, the wiring trenches may be formed first and then contact holes may be formed.

Next, a barrier metal film of, e.g., a Ta film is deposited on the third interlayer insulating film f3 by sputtering, covering the inner surfaces of the contact holes 2cT, 2cM and 2c and wiring trenches 2wT, 2wM and 2w, and a copper seed layer is deposited on the barrier metal layer by sputtering. A copper film is electrolytic-plated on the seed layer.

Next, an unnecessary portion of the copper film, seed layer and barrier metal film is removed by CMP to expose the upper surface of the third interlayer insulating film f3 and leave second contact layers 2cT, 2cM and 2c and second wiring layers 2wT, 2wM and 2w in the contact holes 2cT, 2cM and 2c and the wiring trenches 2wT, 2wM and 2w.

In dual damascene, although the contact layer and overlaying wiring layers are formed at the same time, for the description simplicity, these contact layers and wiring layers are considered as different metal layers as the crack guard ring forming members. For example, for a contact layer and a wiring layer formed at the same time by dual damascene, a description "a wiring layer is laminated upon a contact layer" may be used in some cases.

A process similar to the process of forming the second contact layers and second wiring layers in the third interlayer insulating film f3 is repeated, to form the third contact layers 3c and the like, the third wiring layers 3w and the like to fifth contact layers 5c and the like, and the fifth wiring layers 5w and the like in the fourth to sixth interlayer insulating films f4 to f6.

Further (as will be described with reference to FIGS. 11D and 11E), the sixth contact layers 6c and the like, the sixth wiring layers 6w and the like to the ninth contact layers 9c and the like, and the ninth wiring layers 9w and the like are formed in upper interlayer insulating films f7 to f10 by dual damascene in a similar manner. Widths and heights of the contact layers and heights of the wiring layers are different from those of the lower layers.

Figure 11D:
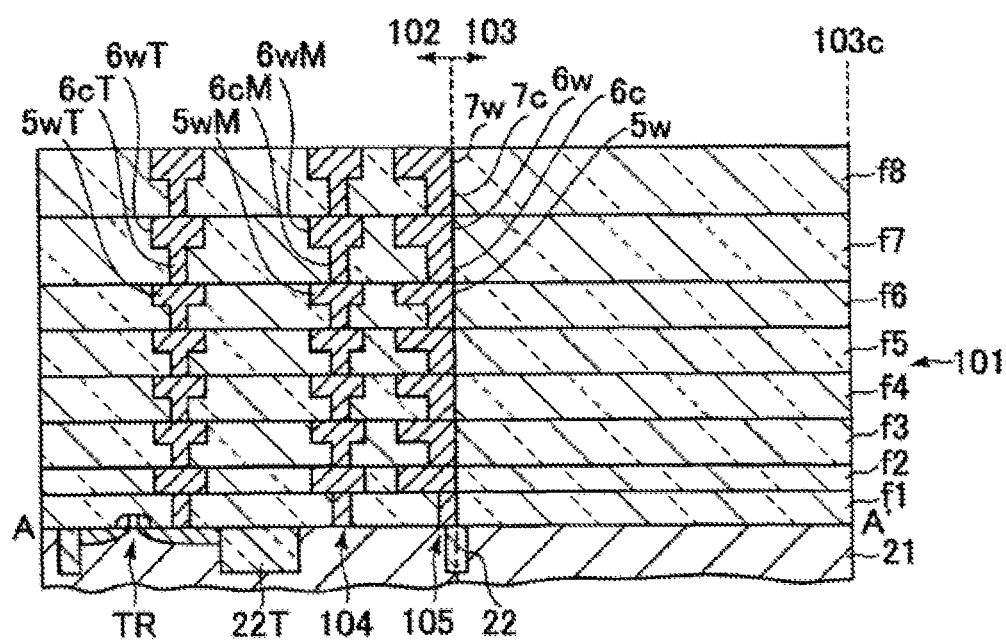

Reference is made to FIG. 11D. Sixth contact layers 6cT, 6cM and 6c and sixth wiring layers 6wT, 6wM and 6w in the seventh interlayer insulating film f7 are formed, e.g., in the following manner.

Deposited are a silicon carbide film (about 70 nm thick), an silicon oxide carbide film (about 920 nm thick), a silicon oxide film (about 30 nm) of TEOS, a silicon nitride film (about 50 nm thick), and a silicon oxide film (about 10 nm thick). A resist pattern having openings of contact hole shapes corresponding to the sixth contact layers 6c and the like is formed on the silicon oxide film. By using this resist pattern as a mask, the silicon oxide film, silicon nitride film, silicon oxide film of TEOS and silicon oxide carbide film are etched.

After the resist pattern is removed, resist (tri-level) is coated. The resist (tri-level) is etched back until the underlying silicon oxide film is exposed, and thereafter a resist pattern having openings of wiring trench shapes corresponding to the sixth wring layer 6w and the like is formed. By using this resist pattern as a mask, the silicon oxide film, silicon nitride film, silicon oxide film of TEOS, and a partial thickness of the silicon oxide carbide film are etched to form the wiring trenches 6w and the like.

The resist pattern is removed thereafter, and the silicon carbide film is removed at the same time when the silicon oxide film and silicon nitride film are etched and removed to expose on the bottoms of the contact holes 6c and the like the underlying fifth wiring layers 5w and the like. As the seventh interlayer insulating film f7 formed with the sixth contact layers 6c and the like and the sixth wiring layers 6w and the like, a lamination portion of the silicon carbide film, silicon oxide carbide film and silicon oxide film of TEOS is left.

A depth of each of the wiring trenches 6wT, 6wM and 6w from the upper surface of the seventh interlayer insulating film f7 is, e.g., about a half of a thickness of each of the silicon oxide carbide film and the silicon oxide film of TEOS, and about 0.5 micrometer. A height of each of the contact holes 6cT, 6cM and 6c is, e.g., about 0.5 micrometer, correspondingly. A width of each of the sixth contact layers 6cM and 6c of the moisture proof ring 104 and crack guard ring 105 is, e.g., about 0.24 micrometer.

The sixth contact layers 6cT, 6cM and 6c and the sixth wiring layers 6wT, 6wM and 6w are formed in the contact holes and wiring trenches in the seventh interlayer insulating film f7 by copper plating and CMP.

Thereafter, a process similar to a process of forming the sixth contact layers 6cT, 6cM and 6c and sixth wiring layers 6wT, 6wM and 6w in the seventh interlayer insulating film f7 is repeated, the seventh contact layers 7c and the like and the seventh wiring layers 7w and the like are formed in the eighth interlayer insulating film f8.

Figure 11E:
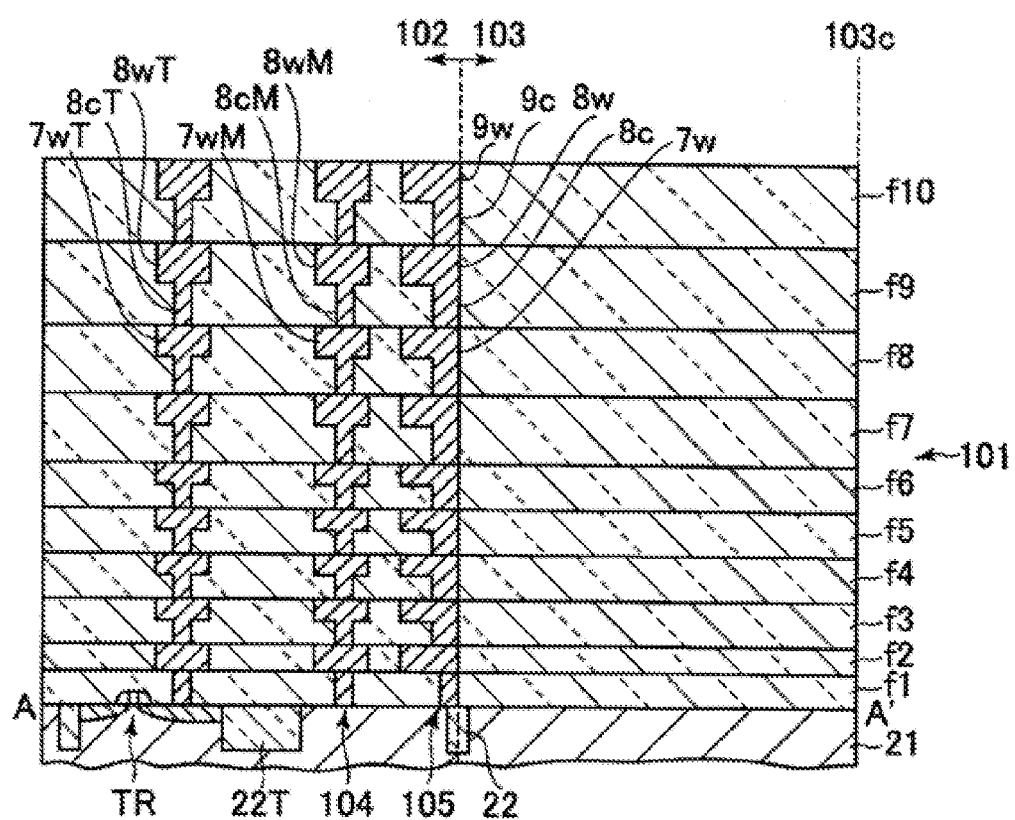

Reference is made to FIG. 11E. Eighth contact layers 8cT, 8cM and 8c and eighth wiring layers 8wT, 8wM and 8w in the ninth interlayer insulating film f9 are formed, e.g., in the following manner.

Deposited are a silicon carbide film (about 70 nm thick), a silicon oxide film (about 1500 nm thick), a silicon oxide film (about 30 nm thick) of TEOS, and a silicon nitride film (about 50 nm thick). A resist pattern having openings of contact hole shapes corresponding to the eight contact layers 8c and the like is formed on the silicon nitride film. By using this resist pattern as a mask, the silicon nitride film, silicon oxide film of TEOS, and the underlying silicon oxide film are etched.

After this resist pattern is removed, resist (tri-level) is coated. The resist (tri-level) is etched back until the underlying silicon nitride film is exposed, and thereafter a resist pattern having openings of wiring trench shapes corresponding to the eighth wiring layers 8w and the like is formed. By using this resist pattern as a mask, the silicon nitride film, silicon oxide film of TEOS and a partial thickness of the underlying silicon oxide film are etched to form the wiring trenches 8w and the like.

The resist pattern is removed thereafter, and the silicon carbide film is removed at the same time when the silicon nitride film is etched and removed to expose on the bottoms of the contact holes 8c and the like the underlying fifth seventh wiring layers 7w and the like. As the ninth interlayer insulating film f9 formed with the eighth contact layers 8c and the like and the eighth wiring layers 8w and the like, a lamination portion of the silicon carbide film, silicon oxide film and silicon oxide film of TEOS is left.

A depth of each of the wiring trenches 8wT, 8wM and 8w from the upper surface of the ninth interlayer insulating film f9 is, e.g., about a half of a thickness of each of the silicon carbide film and the silicon oxide film, and about 0.8 micrometer. A height of each of the contact holes 6cT, 6cM and 6c is, e.g., about 0.8 micrometer, correspondingly. A width of each of the sixth contact layers 6cM and 6c of the moisture proof ring 104 and crack guard ring 105 is, e.g., about 0.38 micrometer.

The eighth contact layers 8cT, 8cM and 8c and the eighth wiring layers 8wT, 8wM and 8w are formed in the contact holes and wiring trenches in the ninth interlayer insulating film f9 by copper plating and CMP.

Thereafter, a process similar to a process of forming the eighth contact layers 8cT, 8cM and 8c and eighth wiring layers 8wT, 8wM and 8w in the ninth interlayer insulating film f9 is repeated to form the ninth contact layers 9c and the like and the ninth wiring layers 9w and the like in the tenth interlayer insulating film f10.

Figure 11F:
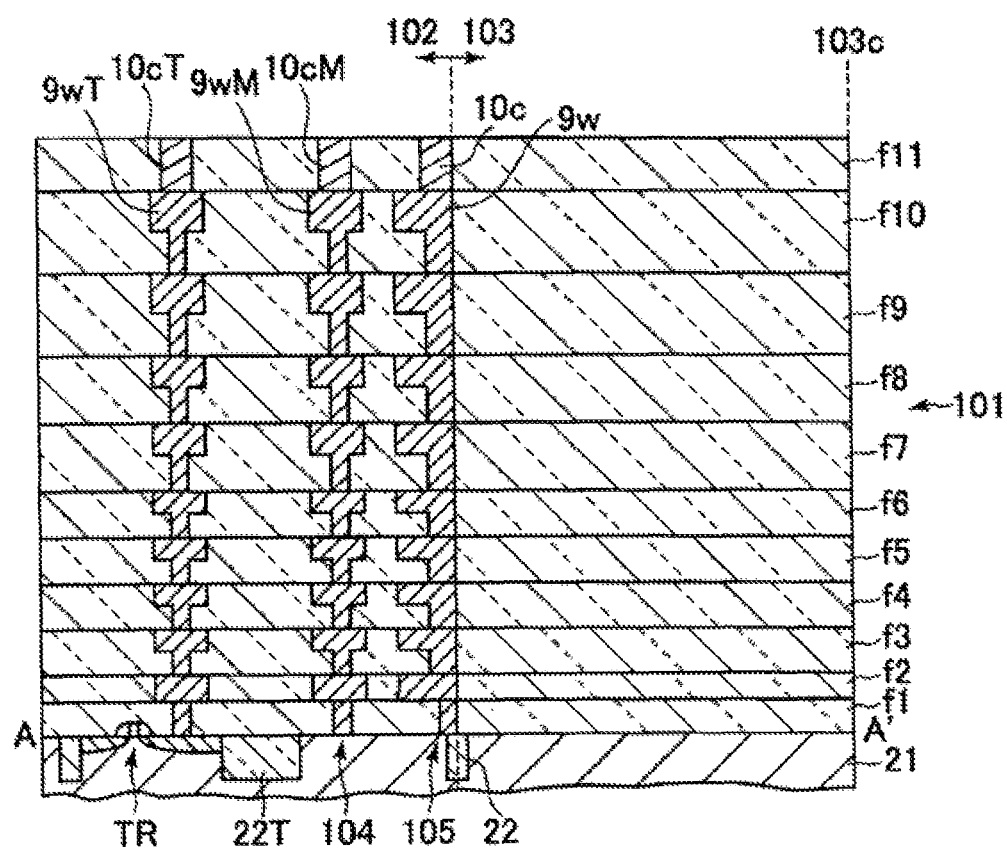

Reference is made to FIG. 11F. An eleventh interlayer insulating film f11 is formed on the tenth interlayer insulating film f10, covering the ninth wiring layers 9wT, 9wM and 9w. The eleventh interlayer insulating film f11 is formed, e.g., in the following manner. A silicon carbide film is deposited on the tenth interlayer insulating film f10 by CVD to a thickness of about 70 nm, and a silicon oxide film is deposited on the silicon carbide film by CVD to a thickness of about 1200 nm. An upper surface of the silicon oxide film is polished by CMP to a thickness of about 300 to 400 nm to planarize the upper surface. In this manner, the eleventh interlayer insulating film f11 having a thickness of, e.g., about 1 micrometer is formed.

Next, contact holes 10cT, 10cM and 10c for burying the tenth contact layers of the moisture proof ring 104 and crack guard ring 105 together with wirings are formed. A width of each of the tenth contact layers 10cM and 10c of the moisture proof ring 104 and crack guard ring 105 is, e.g., about 0.48 micrometer.

The tenth contact layers 10cT, 10cM and 10c are formed in the contact holes 10cT, 10cM and 10 by depositing a barrier metal film such as a Ti film, depositing a W film, and CMP.

Figure 11G:
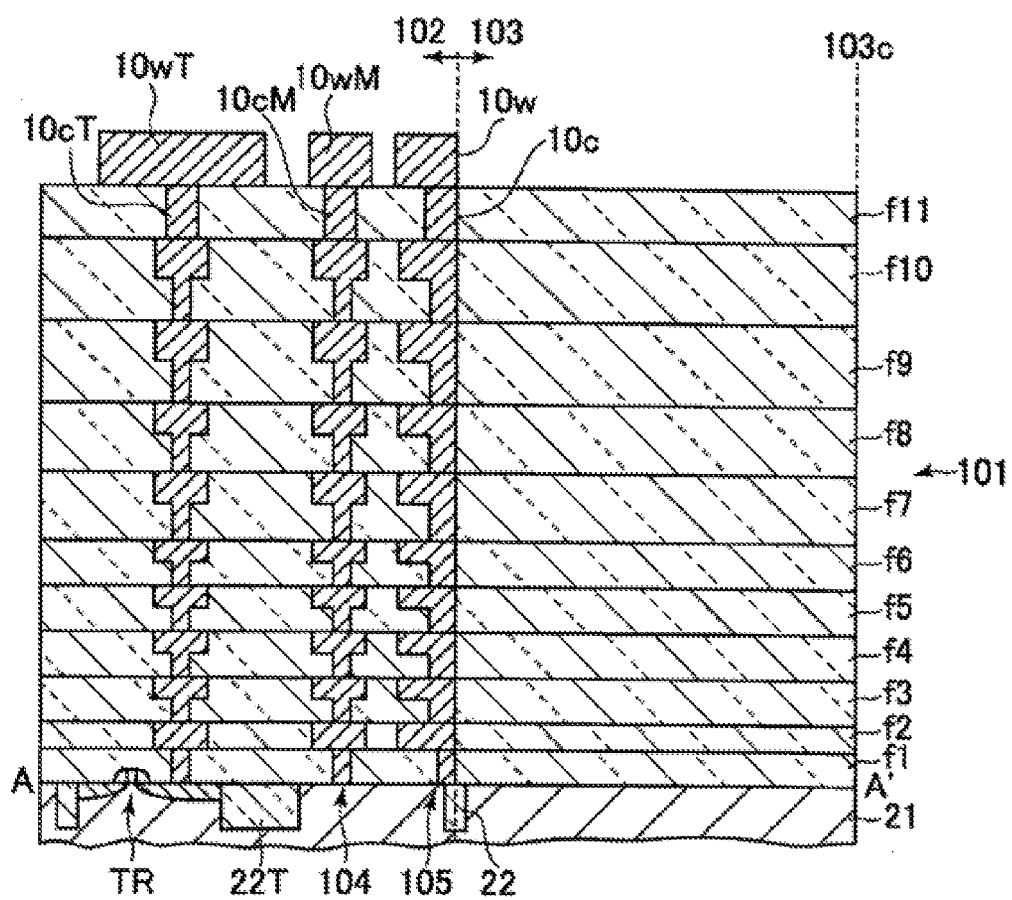
Figure 11H:
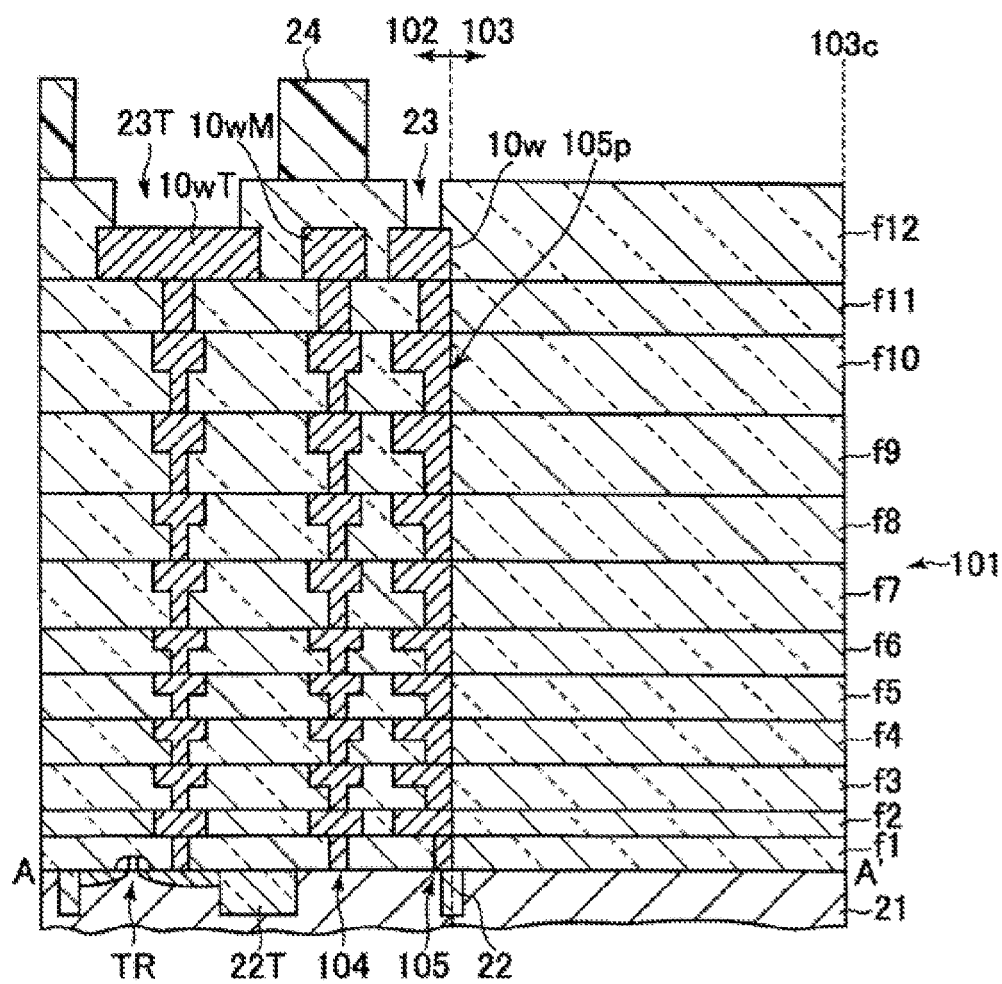

Reference is made to FIG. 11G. Aluminum wiring material is deposited to a thickness of about 1100 nm and patterned to form tenth wiring layers 10wT, 10wM and 10w for wirings, and the moisture ring 104 and crack guard ring 105 as the uppermost metal layers.

Reference is made to FIG. 11H. A cover insulating film f12 is formed on the eleventh interlayer insulating film f11, covering the tenth wiring layers 10wT, 10wM and 10w. For example, the cover insulating film f12 is formed by depositing a silicon oxide film on the eleventh interlayer insulating film f11 by CVD to a thickness of, e.g., about 1400 nm, and by depositing silicon nitride on the silicon oxide film by CVD to a thickness of about 500 nm.

Next, a contact window 23T for exposing the wiring layer 10w of the multi-layer wirings and a crack guard window 23 for exposing the wiring layer 10w of the crack guard ring 105 are formed in the cover insulating film f12. Similar to the first embodiment, an insulating film 24 of polyimide or the like is formed, if necessary, on the cover insulating film f12.

Similar to the first embodiment, the crack guard window 23 is included in a width of the wiring layer 10w. A width of the crack guard window 23 of the fifth embodiment is, e.g., 1 to 3 micrometers (typically, 1.5 micrometers).

The function of the crack guard ring structure of the fifth embodiment is similar to the function of the crack guard ring structure of the first embodiment described with reference to FIGS. 3 and 4.

The semiconductor wafer 101 equipped with the crack guard ring structure of the fifth embodiment is formed in the manner described above. The number of layers in multi-layer wiring, i.e., the number of metal layers for forming the crack guard ring may be properly selected depending upon the kind of a semiconductor chip.

Figure 12:
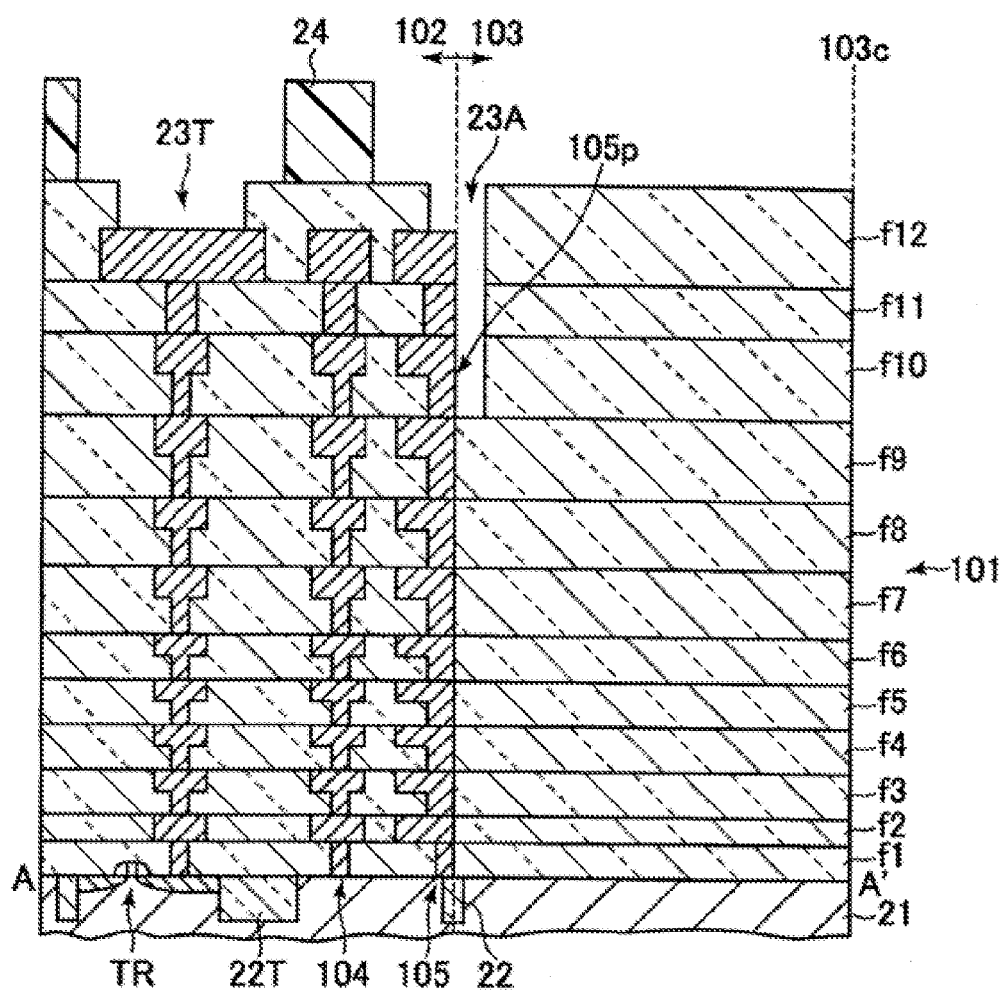
FIG. 12 is a schematic cross sectional view in a thickness direction illustrating a semiconductor wafer equipped with a crack guard ring structure of a sixth embodiment.

Next, with reference to FIG. 12, description will be made on a crack guard ring structure of the sixth embodiment. The sixth embodiment corresponds to the second embodiment. Namely, in the crack guard ring structure of the fifth embodiment, the crack guard window 23A is formed deep so that the side wall 105p of the crack guard ring 105 is exposed similar to the second embodiment. In the example of the crack guard window 23A illustrated in FIG. 12, the cover insulating film f12, eleventh interlayer insulating film f11 and tenth interlayer insulating film f10 are etched.

The crack guard window 23A of the sixth embodiment may be formed in a manner similar to the crack guard window 23A of the second embodiment. A width of the crack guard window 23A of the sixth embodiment is, e.g., 1 to 4 micrometers (typically 2 micrometers).

Similar to the second embodiment, in the crack guard ring structure of the sixth embodiment, it is possible to make widths of the wiring layers 1w to 10w of the sixth embodiment narrower than those of the fifth embodiment. A width of the crack guard window 23A of the sixth embodiment is e.g., 1 to 4 micrometers (typically 2 micrometers).

Similar to the second embodiment, in the crack guard ring structure of the sixth embodiment, it is possible to make the widths of the wiring layers 1w to 10w narrower than those of the sixth embodiments. The widths of the wiring layers 1w to 10w of the sixth embodiment are, e.g., 1 to 4 micrometers (typically about 1.5 micrometers). The function of the crack guard ring structure of the sixth embodiment is similar to the function of the crack guard ring structure of the second embodiment described with reference to FIG. 7. Similar to the modification of the second embodiment, the crack guard window 23A may extend the whole width of the scribe area 103.

Figure 13:
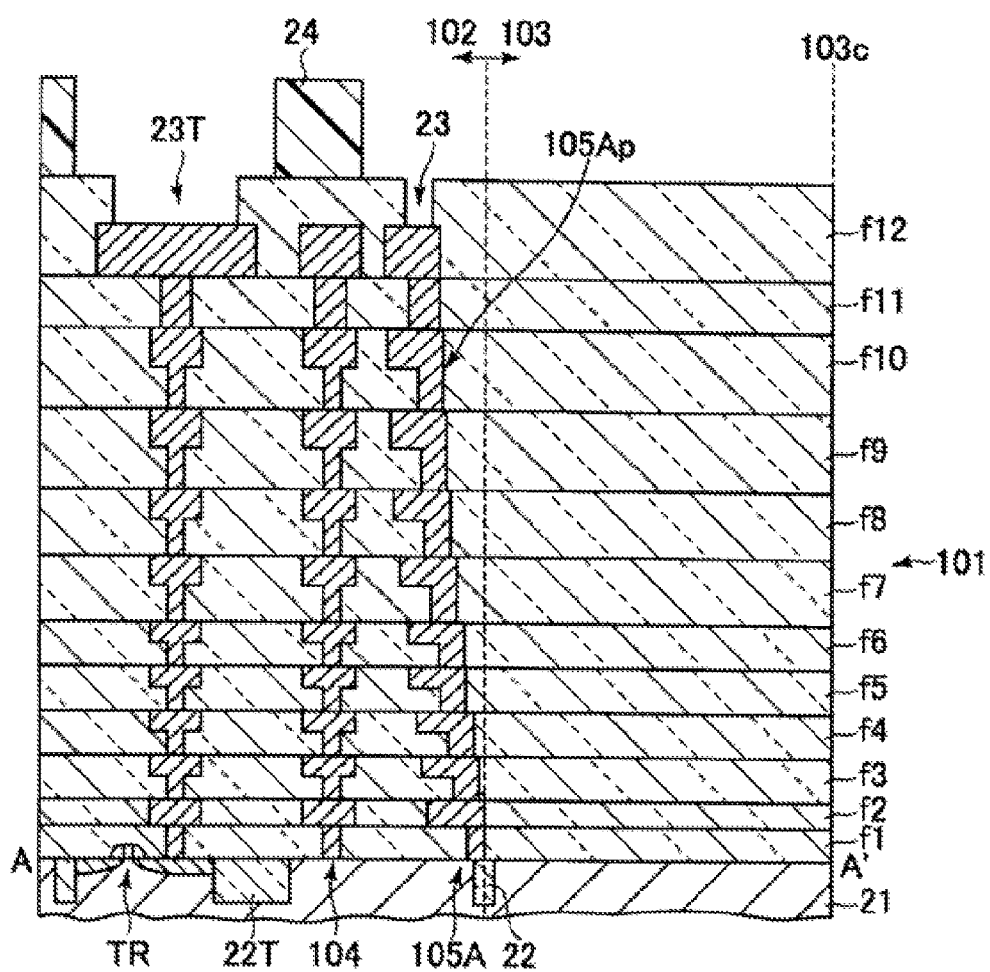
FIG. 13 is a schematic cross sectional view in a thickness direction illustrating a semiconductor wafer equipped with a crack guard ring structure of a seventh embodiment.

Next, with reference to FIG. 13, description will be made on a crack guard ring structure of the seventh embodiment. The seventh embodiment corresponds to the third embodiment. Namely, the side wall 105Ap of the crack guard ring 105A is inclined toward the semiconductor chip area 102 side, the upper portion being nearer to the semiconductor chip 102 side. The crack guard ring 105A of the seventh embodiment is able to be formed by partially modifying the manufacture method for the crack guard ring 105 of the fifth embodiment.

However, the crack guard ring 105A of the seventh embodiment includes a metal layer formed by dual damascene at the intermediate height. During a dual damascene process, the end of the wiring layer on the scribe area 103 side to be formed on the contact layer will not be disposed on the semiconductor chip area 102 side more than the end of the contact layer on the scribe area 103 side.

The ends of the contact layer and wiring layer on the scribe area 103 side to be formed at the same time by the dual damascene process are most preferably flush with each other so as not to form the eave portion.

As different from the third embodiment, in the seventh embodiment, the ends of the contact layer and wiring layer to be formed at the same time by the dual damascene process on the scribe area 103 side are made flush with each other. On a wiring layer formed by a dual damascene process, a contact layer to be formed by the next damascene process is disposed being displaced toward the semiconductor chip area 102 side. A displacement width is, e.g., a half or narrower than a width of the contact layer to be formed on the wiring layer.

In the process of forming a contact layer and a wiring layer by patterning a single layer, it is possible to displace the wiring layer on the contact layer similar to the third embodiment to form the inclined side wall 105Ap. Also in this process, it is possible to make the ends of the contact layer and upper wiring layer on the scribe area 103 side be flush with each other. The function of the crack guard ring structure of the seventh embodiment is similar to the function of the crack guard ring structure of the third embodiment described with reference to FIG. 9.

Figure 14:
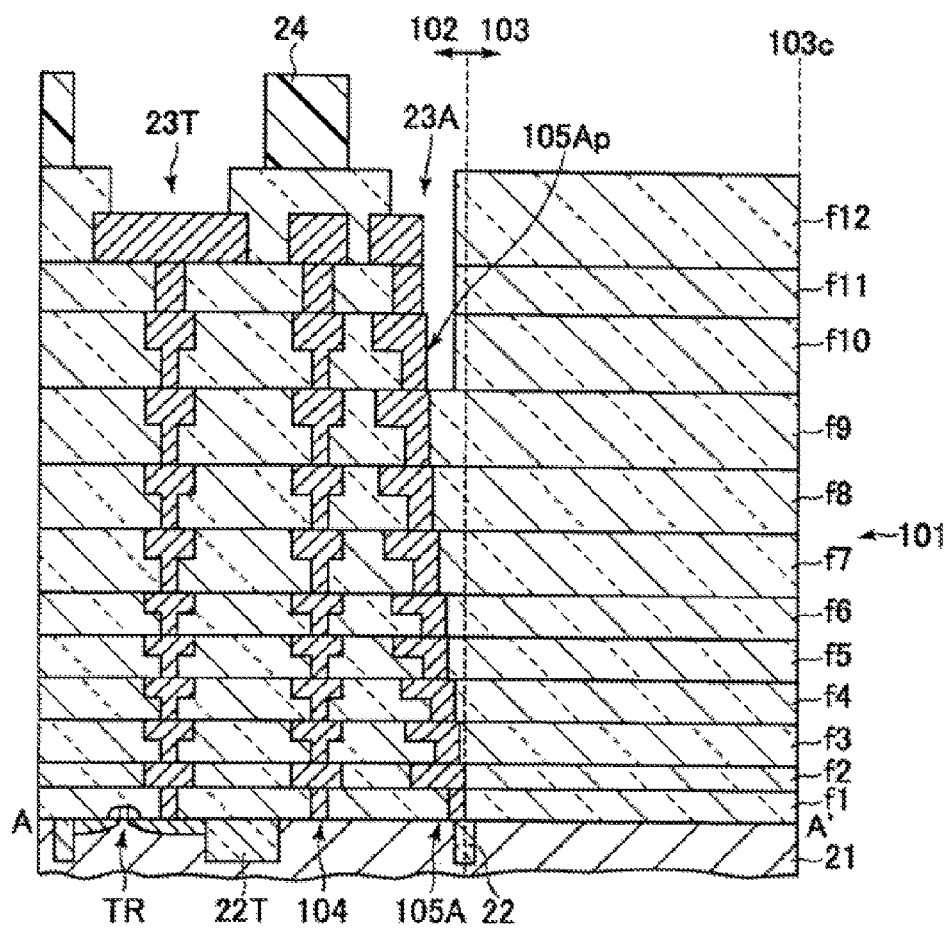
FIG. 14 is a schematic cross sectional view in a thickness direction illustrating a semiconductor wafer equipped with a crack guard ring structure of an eighth embodiment.

Next, with reference to FIG. 14 description will be made on a crack guard ring structure of the eighth embodiment. The eighth embodiment corresponds to the fourth embodiment, and has the crack guard window 23A having a depth exposing the inclined side wall 105Ap of the crack guard ring 105A.

The crack guard window 23A is able to be formed in the manner similar to the sixth embodiment. The function of the crack guard ring structure of the eighth embodiment is similar to the function of the crack guard ring structure of the fourth embodiment.

In the first to eighth embodiments, the crack guard rings having smooth side walls (first, second, fifth and sixth embodiments) or stepwise inclined side walls (third, fourth, seventh and eighth embodiments) have been described. The first to fourth embodiments use aluminum wiring techniques, and the fifth to eighth embodiments use copper wiring techniques.

As described in the third embodiment, even with smooth side wall design (first, second, fifth and sixth embodiments), there is a possibility that concave and convex (irregular) side wall of the crack guard ring is formed because of errors during manufacture processes.

Figure 16:
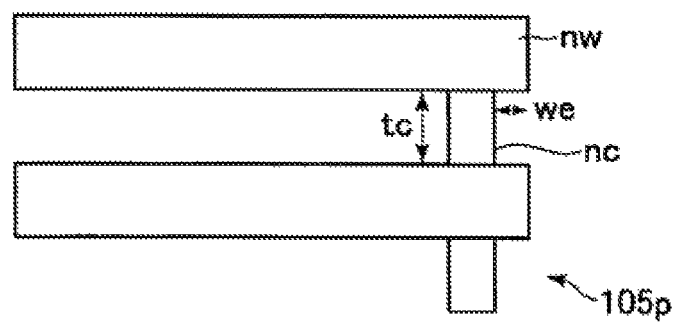
FIG. 16 is a schematic cross sectional view illustrating an eave portion formed on the side wall of the crack guard ring on the side of the scribe area.

Namely, as illustrated in FIG. 16, an eave portion having an error projection width we may be formed on the side wall 105p. An error at the maximum is estimated.

First, consider an error in aluminum wiring techniques (e.g., refer to FIG. 2). Error factors include line width variation and alignment variation. An allowable displacement amount for determining the alignment variation changes with technologies to be used. It is assumed that the technologies are 0.18 micrometer technologies.

A line width variation includes a wiring layer width variation and a contact layer width variation. A wiring layer variation is assumed to about 20% maximum on both sides (10% maximum on one side) if a wiring layer width is 1.5 micrometers. Since one side is to be considered, a variation is about 0.15 micrometer. A contact layer width variation is about 15% maximum on both sides (about 7.5% maximum on one side) if a contact layer width is 0.3 micrometer. Since one side is to be considered, a variation is about 0.0225 micrometer.

An alignment variation is estimated as an allowable displacement amount of the wiring layer relative to the underlying contact layer. An allowable displacement amount in 0.18 micrometer technologies is 0.15 micrometer at the maximum.

Simple addition of these variations is a wiring layer width variation 0.15 micrometer+a contact layer width variation 0.0225 micrometer+alignment variation 0.15 micrometer=0.3225 micrometer. Since a possibility that these variations are formed at the same time is low. A root square sum of these variations of 0.21 micrometer is considered to be more proper estimation.

Therefore, as illustrated in FIG. 16, a projection width we of an eave portion formed by an error of the wiring layer nw laminated upon the contact layer nc is estimated to be about 0.21 micrometer at the maximum. A height (thickness) tc of the contact layer nc is, e.g., about 460 nm.

As a factor for estimating smoothness of the side wall of a lamination of the lower metal layer and an upper metal layer laminated upon the lower metal layer, for example, a ratio of w/t may be adopted where w is a projection width of the eave portion of the upper metal layer and t is a height (thickness) of the lower metal layer. If ideally smooth w=0 so that a smoothness factor w/t=0.

In the example under consideration, a height tc of the contact layer nc is 460 nm, and a projection width we is 210 nm. A smoothness factor w/t at the maximum error is estimated to be 210 nm/460 nm=about 0.46.

Next, errors using copper wiring techniques are considered (e.g., refer to the sixth embodiment). Error factors are similar to aluminum wiring techniques. 90 nm technologies are assumed for the alignment variation, and the uppermost portion having the largest allowable displacement amount will be considered.

A wiring layer width variation is estimated to be about 20% at the maximum on both sides (about 10% at the maximum on one side) if a wiring layer with is 1.5 micrometers. Since one side is to be considered, about 0.15 micrometer. If a contact layer width is 0.4 micrometer, a contact layer width variation is estimated about 15% at the maximum on both sides (about 7.5% at the maximum on one side). Since one side is to be considered, about 0.03 micrometer.

An alignment variation is estimated as an allowable displacement amount of the wiring layer relative to the underlying contact layer. An allowable displacement amount in 90 nm technologies is 0.3 micrometer (alleviated more than 0.18 micrometer technologies).

Simple addition of these variations is a wiring layer width variation 0.15 micrometer+a contact layer width variation 0.03 micrometer+alignment variation 0.3 micrometer=0.48 micrometer. Since a possibility that these variations are formed at the same time is low. A root square sum of these variations of 0.34 micrometer is considered to be more proper estimation.

Therefore, as illustrated in FIG. 16, a projection width we of an eave portion formed by an error of the wiring layer nw laminated upon the contact layer nc is estimated to be about 0.34 micrometer at the maximum. A height (thickness) tc of the contact layer nc is, e.g., about 1 micrometer. In this case, a smoothness factor w/t at the maximum error is estimated to be 0.34 micrometer/1 micrometer=0.34.

If the smoothness factor w/t is smaller than 1, the crack ring breaking suppress effects are expected to be obtained to some degree even if the eave portion is formed on the side wall. It is preferable that the smoothness factor w/t is 1/2 or smaller. It is more preferable that a smoothness factor is 0 (i.e., a flush state of the outer side wall of the laminated metal layers).

Even if the upper portion of the side wall is inclined toward the semiconductor chip area side (refer to third, fourth, seventh and eighth embodiments), there is a possibility that the eave portion is formed on the side wall of an actually manufactured crack guard ring because of errors during manufacture processes.

In this case, if only a region with the eave portion is viewed, it is viewed that the side wall is inclined locally toward the scribe area side. However, if the whole of the crack guard ring from the lower portion to the upper portion is viewed, errors are averaged and the side wall is inclined toward (the upper portion is becoming nearer to) the semiconductor chip area side as a whole.

In the case that a smooth (or vertical) side wall is formed (refer to first, second, fifth and sixth embodiments), even if a concave and convex (irregular) side wall is formed because of errors during manufacture processes, if the whole of the crack guard ring from the lower portion to the upper portion is viewed, errors are averaged and it may be said that the side wall of the crack guard ring is formed vertically to the substrate surface.

In summary of the first to eighth embodiments and views regarding the embodiments, in order to suppress the crack guard ring (metal ring) formed by laminating metal layers from being broken by crack propagation, the following superposition conditions are particularly preferable for a lower metal layer and an upper metal layer to be superposed upon the lower metal layer.

It is preferable that an upper metal layer is superposed upon a low metal layer in such a manner that the end of the upper metal layer on the scribe area side is flush with the end of the lower metal layer on the scribe area side or is positioned (retracted) in the inside of the semiconductor chip area relative to the end of the lower metal layer on the scribe area side.

Figure 15:
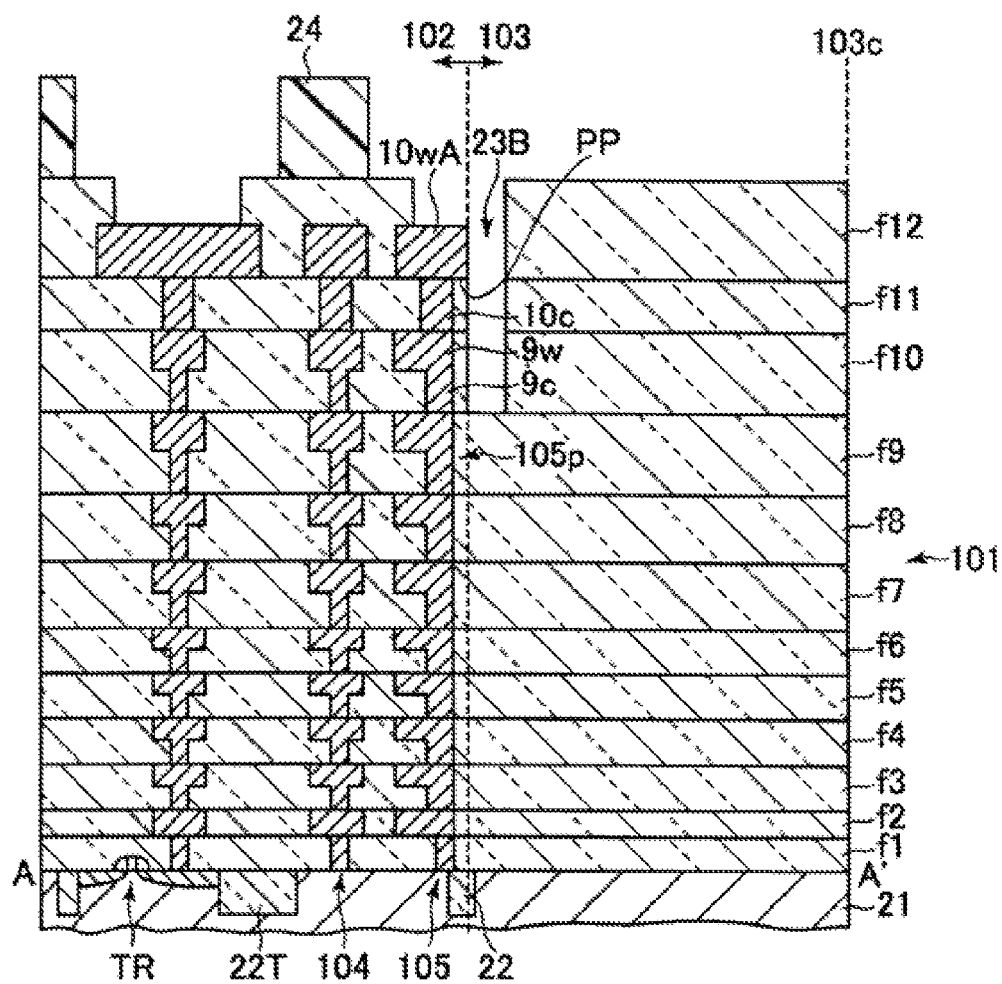
FIG. 15 is a schematic cross sectional view in a thickness direction illustrating a semiconductor wafer equipped with a crack guard ring structure of a ninth embodiment.

Next, with reference to FIG. 15, a crack guard ring structure of the ninth embodiment will be described. The ninth embodiment is obtained partially modifying the sixth embodiment. A difference from the sixth embodiment is the structure of the crack guard window. In order to change the structure of the crack guard window, the layout of the uppermost tenth wiring layer is changed.

More specifically, in the ninth embodiment, the tenth wiring layer $10w$A is laminated on the tenth contact layer $10c$ to positively form the eave portion PP. A projection amount is set preferably in such a manner that the smoothness factor becomes smaller than 1 when the crack guard ring structure is formed.

While the crack guard window 23B is etched, the interlayer insulating film under the eave portion PP is not etched because of the eave portion. The crack guard window 23B is formed to a depth at an intermediate height of the crack guard ring 105 on the scribe area 103 side. However, since the interlayer insulating film just under the eave portion is not etched, the side wall 105 of the tenth contact layer $10c$ and underlying layers is not exposed in the crack guard window 23B.

In the sixth embodiment, the copper layers of the side wall $105p$ of the crack guard ring 105 is exposed in the crack guard window 23A. If a chamber for etching the crack guard window 23A is usable to work the copper layer, there is no problem even if the copper layer is exposed. However, there is a case that exposing the copper layer is not desired if copper contamination of the chamber is not desired. In this case, it is possible as in the ninth embodiment to form the crack guard window 23B not exposing the copper layer. This structure is applicable for the case wherein the side wall $105p$ is not desired to be exposed in a region lower than the uppermost layer $10w$A because of some reasons.

If the eave portion PP is reliably formed in the finished state, it is preferable that a projection design width of the tenth wiring layer $10w$A is set larger to some extent. A projection width set value is estimated. In this example, the eleventh interlayer insulating film f11 and tenth interlayer insulating film f10 are etched in the crack guard window 23B under the tenth wiring layer $10w$A. Namely, the side wall of the tenth contact layer $10c$, ninth wiring layer $9w$ and ninth contact layer $9c$ are desired not to be exposed.

Assuming the 90 nm technologies, a maximum allowable displacement amount of the tenth wiring layer $10w$A relative to the underlying contact layer $10c$ is set to 0.3 micrometer, a maximum allowable displacement amount of the ninth wiring layer $9w$ relative to the underlying contact layer $10c$ is set to 0.1 micrometer, and a maximum allowable displacement amount of the ninth wiring layer $9w$ relative to the underlying contact layer $9c$ is set to 0.065 micrometer. In this case, a maximum alignment variation (allowable displacement amount) of the uppermost wiring layer $10w$A relative to the contact layer two layers lower is estimated to be 0.33 micrometer from a root of square sums of the maximum line width variations of 0.3 micrometer, 0.1 micrometer, and 0.065 micrometer.

Line width variations of the tenth wiring layer $10w$A and ninth wiring layer $9w$ are estimated to be 0.15 micrometer at the maximum. Since the ninth contact layer $9c$ is narrow than the wiring layers $9w$ and $10w$, the maximum line width variation is estimated to be 0.21 micrometer from a root of square sums of 0.15 micrometer and 0.15 micrometer.

From the viewpoint of reliably forming the eave portion, for example, a projection width is set to 0.4 micrometer or larger to be obtained from a root of square sums of the alignment variation 0.33 micrometer and a line width variation 0.21 micrometer.

If a projection width of the eave portion PP formed at the tenth wiring layer 10wA is 0.4 micrometer, and a height of the ninth contact layer 9c is, e.g., 1 micrometer, a smoothness factor is 0.4 micrometer/1 micrometer=0.4 which is smaller than 1.

Also in the crack guard ring structure of the ninth embodiment, the crack guard window 23B is formed deep to an intermediate height of the crack guard ring 105. Since the crack guard window 23B is formed very near at the side wall 105p although not exposing the side wall 105p of the crack guard ring 105, the effects of guiding a crack and terminating quickly are obtained similar to the sixth embodiment.

It is considered that a plurality of crack guard rings are disposed in a multiple manner to further improve crack guard.

Next, with reference to FIG. 17, a crack guard ring structure of the tenth embodiment will be described. The tenth embodiment has the structure that double crack guard rings 105A1 and 105A2 are formed.

Similar to the fourth embodiment, the crack guard rings 105A1 and 105A2 are formed by using aluminum wiring techniques, the outer side walls are inclined, and the crack guard window 23A exposes the outer side wall of the inner crack guard ring 105A1.

The outer crack guard ring 105A2 surrounds the inner crack guard ring 105A1, and is formed lower than the inner crack guard ring 105A1. In this example, it is formed to a height of the fourth wiring layer 4w. The outer crack guard ring 105A2 may be formed at the same time when the inner guard ring 105A1 is formed.

The crack guard window 23A is formed to the whole width of the scribe area 103 to thin the lamination insulating film IF left in the scribe area 103 and facilitate chip division.

On the bottom of the crack guard window 23A, the upper portion of the outer crack guard ring 105A2, in this example, the fourth wiring layer 4w is exposed. The crack propagated from the scribe center 103c side propagates along the outer sidewall of the outer crack guard ring 105A2, arrives at the bottom of the crack guard window 23A to be terminated.

Since the outer crack guard ring 105A2 is formed lower than the inner crack guard ring 105A1, a projection height of the outer crack guard ring 105A2 from the bottom of the crack guard window 23A is suppressed. It is therefore possible to suppress the projection portion of the outer crack guard ring 105A2 from being stripped and becoming foreign particles.

The crack guard insulating film 22 is disposed in such a manner that the end thereof on the scribe area 103 side (outer side) is disposed at the outer position than the outer end of the lowermost metal layer of the outer crack guard ring 105A2.

In this embodiment, an insulating film 22A to be formed at the same time when the crack guard insulating film 22 is formed is disposed at the inner side of the lowermost metal layer of the inner crack guard ring 105A1. An area 21A where the crack guard rings 105A1 and 105A2 are disposed is defined between the insulating film 22A and crack guard insulating film 22.

In the tenth embodiment, the crack guard rings 105A1 and 105A2 are formed by using aluminum wiring techniques. For example, as described in the first embodiment with reference to FIG. 2C, a contact layer is formed by a Ti/TiN/W lamination film, and Ti/TiN/Al/Ti/TiN lamination film is formed on the contact layer and patterned to form a wiring layer.

The wiring layer is patterned by forming a resist pattern of a wiring layer shape on the Ti/TiN/Al/Ti/TiN lamination film, and etching the Ti/TiN/Al/Ti/TiN lamination film by using the resist pattern as a mask. Dry etching using mixture gas of, e.g., $Cl_2$, $BCl_3$, Ar and $CHF_3$ is performed as etching and patterning the aluminum wiring layer. After etching, the resist pattern is removed by a chemical process using, e.g., ACT.

In this embodiment, the crack guard ring having the inclined outer side wall is formed. As described in the third embodiment, the wiring layer is laminated on the contact layer, being detracted toward the semiconductor chip area 102 side. The structure that the upper surface of the contact layer just under the wiring layer is exposed outside the wiring layer as viewed in plan is therefore formed. Even if the crack guard ring having the smooth outer side wall is formed, the upper surface of the contact layer may be exposed outside the wiring layer because of displacement.

Figure 17:
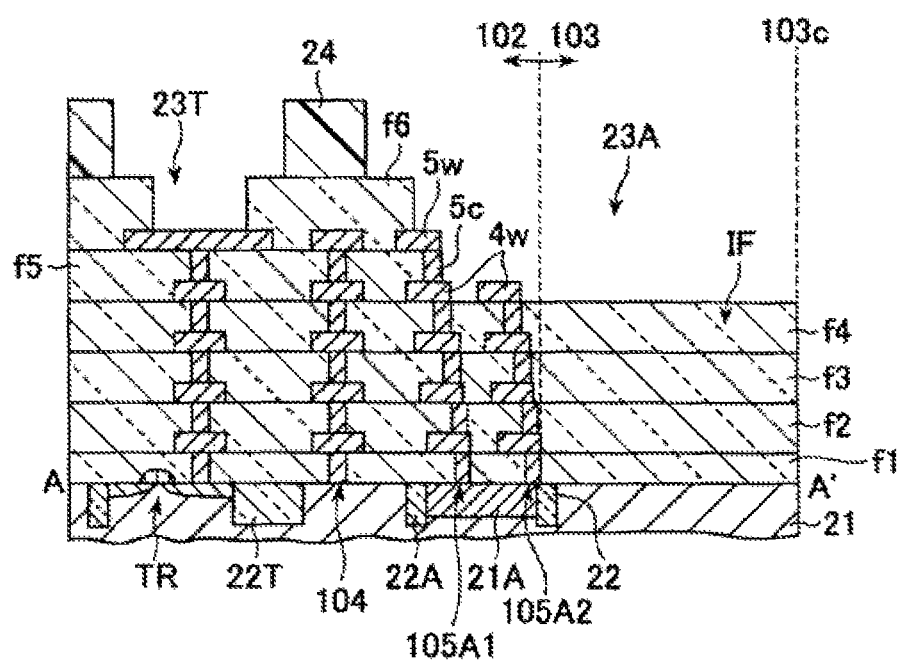
FIG. 17 is a schematic cross sectional view in a thickness direction illustrating a semiconductor wafer equipped with a crack guard ring structure of a tenth embodiment.

If a silicon substrate 21 is, e.g., a p-type substrate, in the process of forming a semiconductor element such as a transistor TR illustrated in FIG. 17, n-type and p-type impurity ions are implanted into the substrate 21. As the impurity ions are implanted, and a pn junction is formed in the region 21A under the lowermost metal layer of the crack guard rings 105A1 and 105A2, the following problem occurs.

The wiring layer is charged positive because of dry etching for patterning the wiring layer. Since the substrate is a p-type, a pn junction having a surface side n-type and an inner side p-type is formed. Positive charges pooled in the wiring layer apply a reverse bias to the pn junction. Positive charges in the wiring layer do not flow into the substrate, but remain in the wiring layer.

As the chemical process is performed to remove the mask on the wiring layer while positive charges are remained in the wiring layer, a battery having the wiring layer and substrate as its electrodes is formed, and the exposed tungsten contact layer melts.

In this embodiment, therefore, impurity ion implantation into the region 21A under the crack guard ring is controlled so as not to form a pn junction in the region 21A under the crack guard ring. For example, the following impurity ion implantation is performed.

When a p-type well is formed, a resist pattern exposing a p-type well forming region is used, and B is implanted, e.g., at an acceleration energy of 300 keV, a dose of $3.0 \times 10^{13}$ cm$^{-2}$ and a tilt angle of 0°.

When an n-type MOS transistor channel is formed, a resist pattern exposing an n-type MOS transistor channel forming region is used, and B ions are implanted, e.g., at an acceleration energy of 30 keV, a dose of $8.5 \times 10^{12}$ cm$^{-2}$ and a tilt angle of 7°.

When a p-type MOS transistor lightly doped drain (LDD) is formed, a resist pattern exposing a p-type MOS transistor LDD forming region is used, and $BF_2$ ions are implanted, e.g., at an acceleration energy of 80 keV, a dose of $4.5 \times 10^{13}$ cm$^{-2}$ and a tilt angle of 0°.

When p-type MOS transistor source/drain are formed, a resist pattern exposing p-type MOS transistor source/drain is used, and B ions are implanted, e.g., at an acceleration energy of 5 keV, a dose of $2.0 \times 10^{15}$ cm$^{-2}$ and a tilt angle of 0°, and F ions are implanted, e.g., at an acceleration energy of 8 keV, a dose of $4 \times 10^{14}$ cm$^{-2}$ and a tilt angle of 0.

In the process of implanting p-type impurity ions, i.e., impurity ions having the same conductivity type as that of the substrate, the resist pattern exposing also the region 21A under the crack guard ring is used to implant impurity ions into the region 21A under the crack guard ring.

In the process of implanting n-type impurity ions, i.e., impurity ions having the conductivity type opposite to that of the substrate, the resist pattern covering the region 21A under the crack guard ring is used not to implant impurity ions into the region 21A under the crack guard ring and to form the n-type well, pMOS transistor channel, n-type MOS transistor lightly doped drain (LSS), and n-type MOS transistor source/drain.

The resist pattern covering the region 21A under the crack guard ring is formed, e.g., by disposing one end thereof in the width of the insulating film 22A and the other end in the width of the crack guard insulating film 22.

By implanting impurity ions having the same conductivity type as that of the substrate into the region 21A under the crack guard ring, it becomes possible to suppress the pn junction from being formed under the crack guard ring so that charges in the crack guard ring are easy to be flowed into the substrate. The problem to be caused by the charged crack guard ring is able to be suppressed. If the pn junction is not formed finally in the region under the crack guard ring, impurity ions having the conductivity type opposite to that of the substrate may be implanted.

Figure 18:
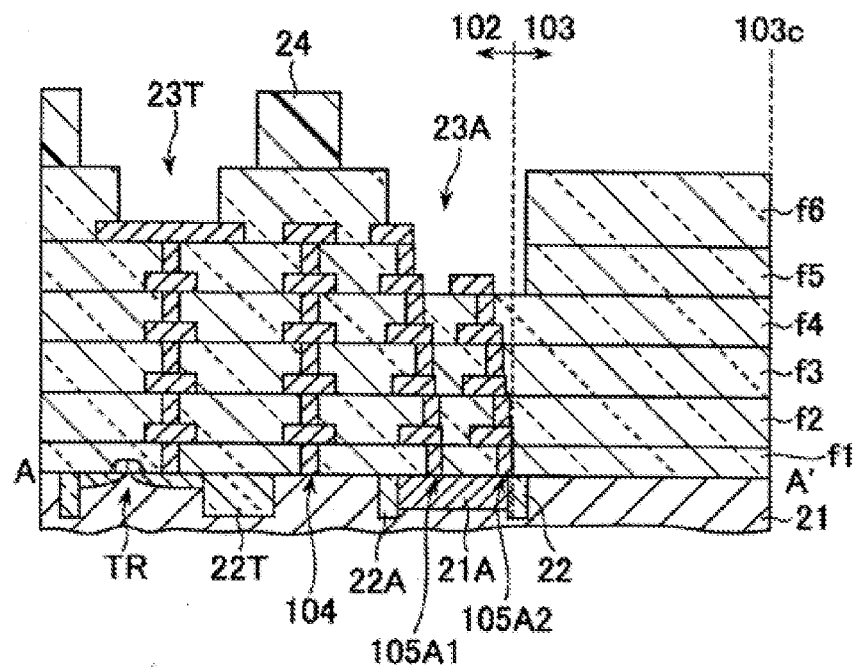
FIG. 18 is a schematic cross sectional view in a thickness direction illustrating a semiconductor wafer according to a modification of the tenth embodiment.

Next, with reference to FIG. 18, description will be made on a crack guard ring according to a modification of the tenth embodiment. In this modification, a width of the crack guard window 23A does not extend to the whole width of the scribe area 103, and the interlayer insulating films f5 and f6 are left to the scribe center 103c side relative to the crack guard window 23A. A width of the crack guard window 23A is wide so that the upper surface of the outer crack guard ring 105A2 is exposed.

Figure 19:
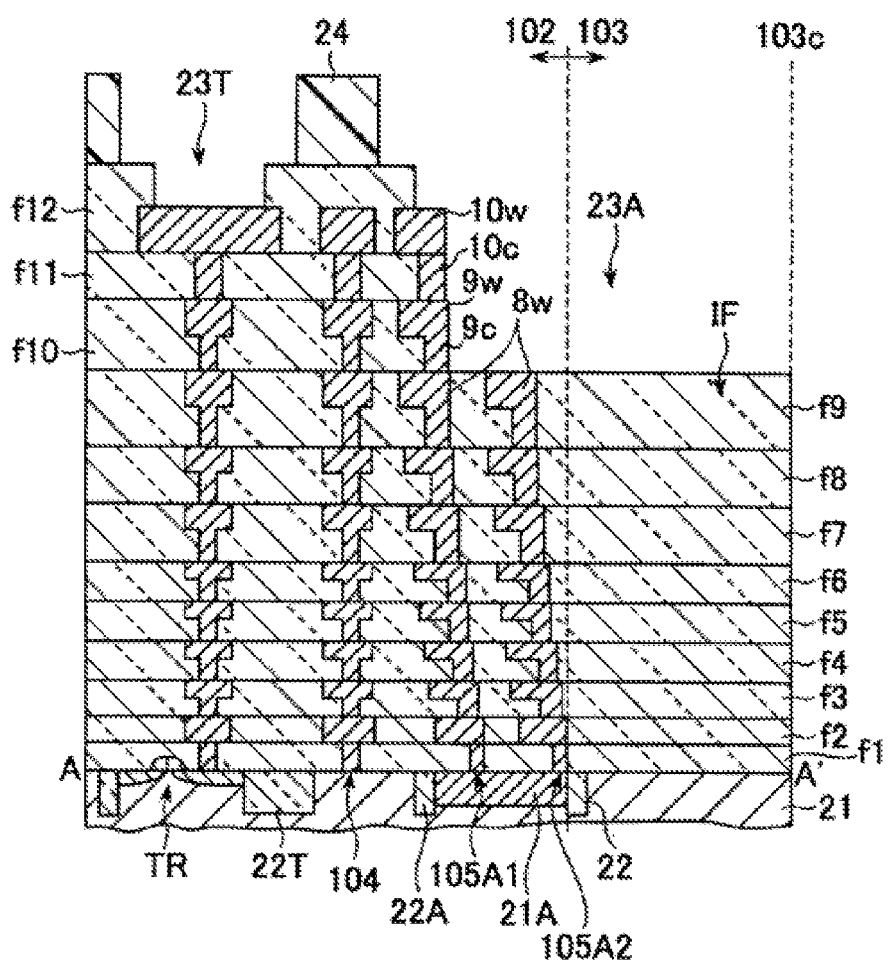
FIG. 19 is a schematic cross sectional view in a thickness direction illustrating a semiconductor wafer equipped with a crack guard ring structure of an eleventh embodiment.

Next, with reference to FIG. 19, description will be made on a crack guard ring of the eleventh embodiment. In the eleventh embodiment, the crack guard ring structure of the tenth embodiment is applied to copper wiring forming techniques.

In the eleventh embodiment, the outer crack guard ring 105A2 is formed to a height of an eighth wiring layer 8w, and the upper surface of the eighth wiring layer 8w is exposed on the bottom of the crack guard window 23A.

Even if the copper wiring forming techniques are used, in the uppermost portion of the wiring structure, the wiring layer 10w of aluminum is formed on the contact layer 10c of tungsten. Therefore, particularly in the inner crack guard ring 105A1 laminating to the aluminum wiring layer 10w, it is preferable that a pn junction is not formed in the region 21A under the crack guard ring.

Figure 20:
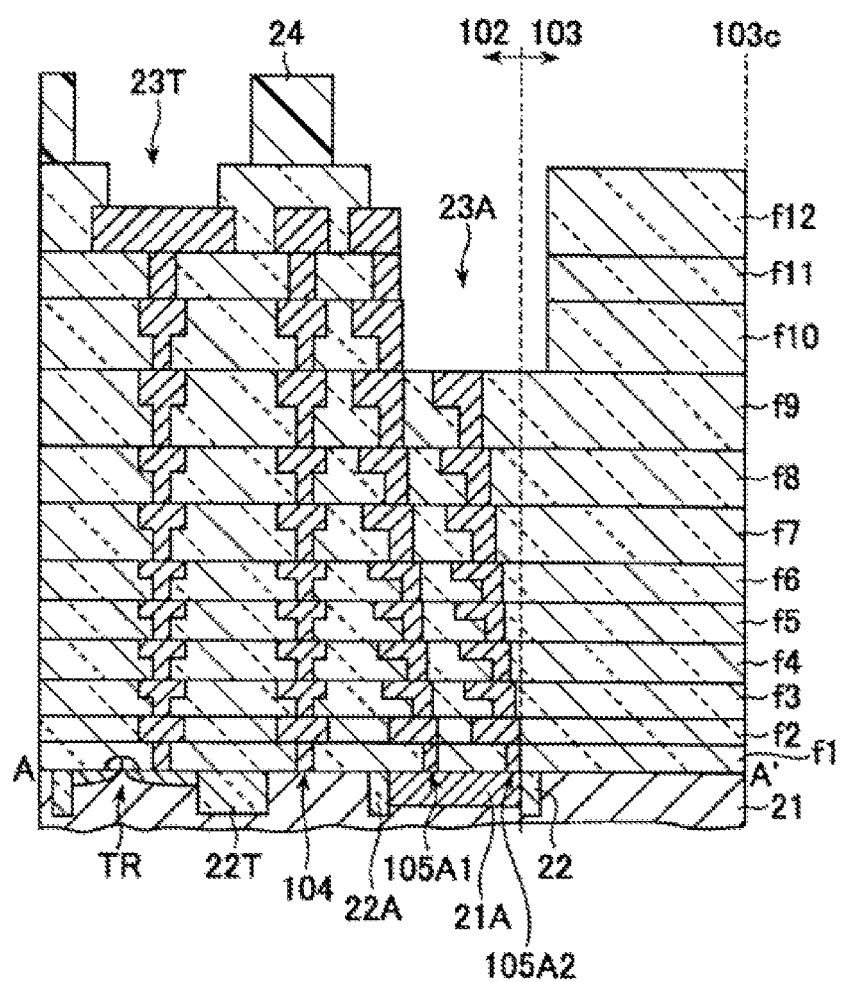
FIG. 20 is a schematic cross sectional view in a thickness direction illustrating a semiconductor wafer according to a modification of the eleventh embodiment.

Next, with reference to FIG. 20, description will be made on a crack guard ring of a modification of the eleventh embodiment. In this modification, the crack guard ring structure of the modification of the tenth embodiment is applied to the copper wiring forming techniques.

As described above, it is possible for the crack guard ring structures of the first to eleventh embodiments to suppress a crack formed during cutting a semiconductor wafer from propagating into the semiconductor chip area.

The crack guard ring is left at the border of each divided semiconductor chip. In a portion where the interlayer insulating film on the scribe area side is stripped, the side wall of the crack guard ring is exposed at the end facet of the semiconductor chip.

Embodiments having the moisture proof ring formed inner than the crack guard ring have been described. It is considered that the moisture proof ring may be omitted by making the crack guard ring serve also as the moisture proof ring.

If the moisture proof ring is formed in addition to the crack guard ring, not only the moisture proof ring having the structure described in the embodiments, but also other heretofore known structures may be formed properly.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A semiconductor device comprising:
    a semiconductor substrate including a first semiconductor chip area formed with a semiconductor element;
    laminated interlayer insulating films formed on said substrate;
    a first metal ring formed in said laminated interlayer insulating films of said first semiconductor chip area, formed in a loop shape, and surrounding said semiconductor element;
    an opening formed in said laminated interlayer insulating films and exposing a part of a first side wall and an upper surface of said first metal ring; and
    a second metal ring formed on said semiconductor substrate and surrounding said first metal ring, an upper surface of said second metal ring being lower than said upper surface of said first metal ring.
2. The semiconductor device according to claim 1, wherein:
    said opening exposes a first part of an outer side wall of said first metal ring; and
    a second part of said outer side wall of said first metal ring is covered by said laminated interlayer insulating films.
3. The semiconductor device according to claim 1, further comprising a lower insulating film disposed lower than said first metal ring in a height direction, wherein an outer end of said lower insulating film is disposed outer relative to an outer end of a lowermost metal layer of said first metal ring.
4. The semiconductor device according to claim 1, wherein said opening exposes said upper surface of said second metal ring.
5. The semiconductor device according to claim 1 wherein:
    said semiconductor substrate has a first conductivity type; and
    a lowermost metal layer of said first metal ring is formed on a semiconductor region of said semiconductor substrate into which impurities of said first conductivity type are implanted.
6. The semiconductor device according to claim 1, wherein:
    said first metal ring includes a first lower metal layer and a first upper metal layer formed directly on said first lower metal layer; and
    said first lower metal layer and said first upper metal layer contain copper and are formed by dual damascene.
7. The semiconductor device according to claim 1 wherein:
    said first metal ring includes a first lower metal layer and a first upper metal layer formed directly on said first lower metal layer;
    said second metal ring includes a second lower metal layer and a second upper metal layer formed directly on said second lower metal layer;
    an outer side wall of said first lower metal layer is nearer from a border of said first semiconductor chip area than an outer side wall of said first upper metal layer; and an outer side wall of said second lower metal layer is nearer from said first metal ring than an outer side wall of said second upper metal layer.

8. The semiconductor device according to claim 1 wherein an outer side wall of said first metal ring is smooth.

* * * * *